United States Patent
Chung et al.

(10) Patent No.: US 10,032,917 B1
(45) Date of Patent: Jul. 24, 2018

(54) THIN FILM TRANSISTOR, GATE DRIVE ON ARRAY AND DISPLAY APPARATUS HAVING THE SAME, AND FABRICATING METHOD THEREOF

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Jaemoon Chung, Beijing (CN); Dongzhen Jin, Beijing (CN); Chao Fan, Beijing (CN); Rongge Cui, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/543,673

(22) PCT Filed: Jul. 8, 2016

(86) PCT No.: PCT/CN2016/089409
§ 371 (c)(1),
(2) Date: Jul. 14, 2017

(87) PCT Pub. No.: WO2018/006412
PCT Pub. Date: Jan. 11, 2018

(51) Int. Cl.
*H01L 29/786* (2006.01)
*H01L 51/05* (2006.01)
(Continued)

(52) U.S. Cl.
CPC ........ *H01L 29/786* (2013.01); *H01L 27/1222* (2013.01); *H01L 27/1259* (2013.01); *H01L 27/283* (2013.01); *H01L 51/0545* (2013.01)

(58) Field of Classification Search
CPC .................. H01L 29/786; H01L 21/76816
See application file for complete search history.

(56) References Cited

U.S. PATENT DOCUMENTS

| 2009/0072228 A1 | 3/2009 | Choi et al. |
| 2013/0112976 A1 | 5/2013 | Kim et al. |
| 2017/0010510 A1 | 1/2017 | Hao et al. |

FOREIGN PATENT DOCUMENTS

| CN | 102723334 A | 10/2012 |
| CN | 103094305 A | 5/2013 |

(Continued)

OTHER PUBLICATIONS

International Search Report & Written Opinion dated Apr. 12, 2017 regarding PCT/CN2016/089409.

*Primary Examiner* — Thomas L Dickey
(74) *Attorney, Agent, or Firm* — Intellectual Valley Law, P.C.

(57) ABSTRACT

The present application discloses a thin film transistor including a base substrate; an active layer on the base substrate having a first semiconductor region, a second semiconductor region, and a plurality of semiconductor bridges each of which connecting the first semiconductor region and the second semiconductor region; the plurality of semiconductor bridges spaced apart from each other; the active layer being made of a material including $M1O_aN_b$, wherein M1 is a single metal or a combination of metals, $a>0$, and $b\geq 0$; an etch stop layer on a side of the active layer distal to the base substrate; the first semiconductor region having a first non-overlapping portion, a projection of which is outside that of the etch stop layer in plan view of the base (Continued)

substrate; the second semiconductor region having a second non-overlapping portion, a projection of which is outside that of the etch stop layer in plan view of the base substrate; a first electrode on a side of the first non-overlapping portion distal to the base substrate; and a second electrode on a side of the second non-overlapping portion distal to the base substrate.

20 Claims, 20 Drawing Sheets

(51) Int. Cl.
*H01L 27/28* (2006.01)
*H01L 27/12* (2006.01)

(56) References Cited

FOREIGN PATENT DOCUMENTS

| | | |
|---|---|---|
| CN | 103941448 A | 7/2014 |
| CN | 104914639 A | 9/2015 |

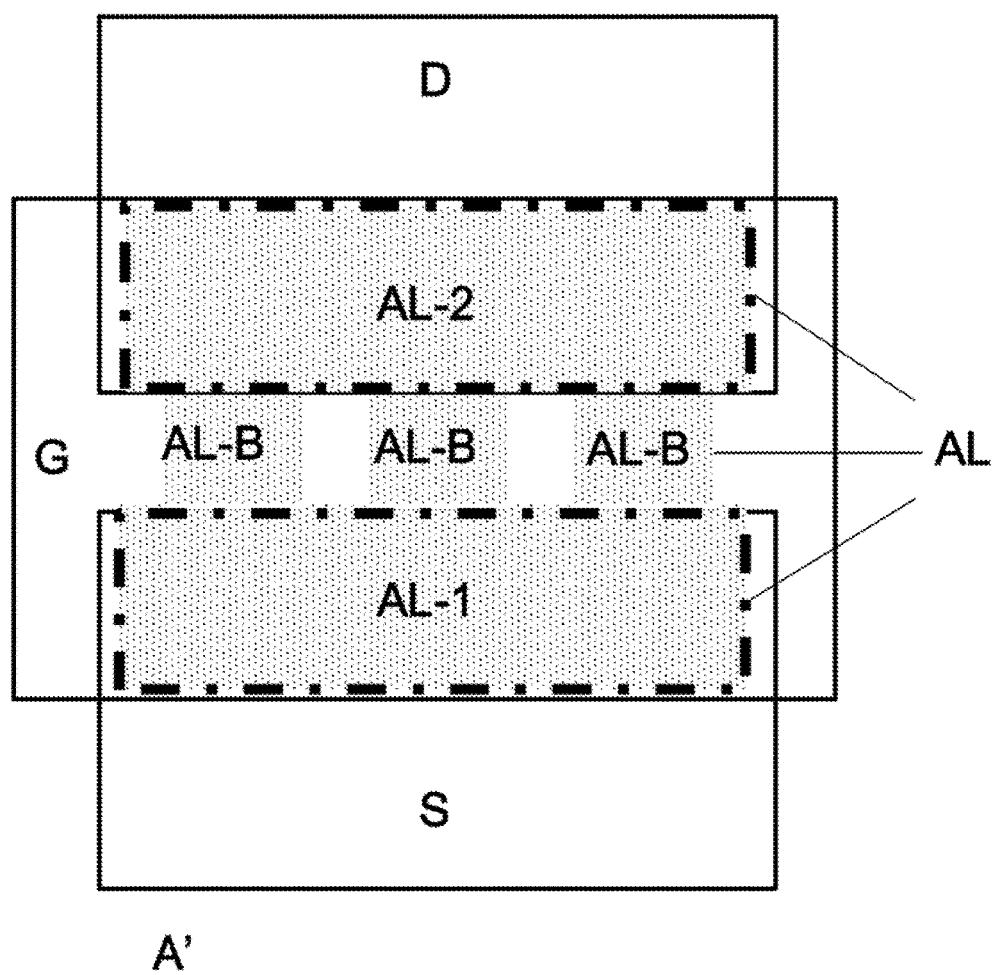

THIN FILM TRANSISTOR, GATE DRIVE ON ARRAY AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/089409 filed Jul. 8, 2016, the contents of which are incorporated by reference in the entirety.

TECHNICAL FIELD

The present invention relates to a thin film transistor, a gate drive on array (GOA) circuit and a display apparatus having the same, and a fabricating method thereof.

BACKGROUND

Metal oxide or metal oxynitride thin film transistors have many advantages such as a higher carrier density and higher mobility. Accordingly, the metal oxide or metal oxynitride thin film transistors can be made smaller, and the display panel made of such thin film transistors can achieve a higher resolution and a better display effect. Moreover, the metal oxide or metal oxynitride thin film transistors have the advantages of lower manufacturing costs, higher transmittance, and higher bad gap. The metal oxide or metal oxynitride thin film transistors have found a wide range of applications in display field.

SUMMARY

In one aspect, the present invention provides a thin film transistor comprising a base substrate; an active layer on the base substrate comprising a first semiconductor region, a second semiconductor region, and a plurality of semiconductor bridges each of which connecting the first semiconductor region and the second semiconductor region; the plurality of semiconductor bridges spaced apart from each other; the active layer being made of a material comprising $MIO_aN_b$, wherein M is a single metal or a combination of metals, a>0, and b≥0; an etch stop layer on a side of the active layer distal to the base substrate; the first semiconductor region comprising a first non-overlapping portion, a projection of which is outside that of the etch stop layer in plan view of the base substrate; the second semiconductor region comprising a second non-overlapping portion, a projection of which is outside that of the etch stop layer in plan view of the base substrate; a first electrode on a side of the first non-overlapping portion distal to the base substrate; and a second electrode on a side of the second non-overlapping portion distal to the base substrate.

Optionally, the first semiconductor region being an integral semiconductor block connecting a plurality of first terminus of the plurality of semiconductor bridges; the second semiconductor region being an integral semiconductor block connecting a plurality of second terminus of the plurality of semiconductor bridges.

Optionally, the first electrode is in contact with the first non-overlapping portion, and the second electrode is in contact with the second non-overlapping portion.

Optionally, the etch stop layer comprises a plurality of etch stop blocks spaced apart from each other, each etch stop block at least partially overlapping with corresponding semiconductor bridge.

Optionally, the plurality of semiconductor bridges are spaced apart from each other by a distance in the range of about 3 µm to about 15 µm.

Optionally, each of the plurality of semiconductor bridges has a width in the range of about 3 µm to about 20 µm.

Optionally, each of the plurality of semiconductor bridges has a rectangular shape.

Optionally, each semiconductor bridge comprises a middle portion having concaved-shaped lateral edges and a width narrower than widths of other portions of the each semiconductor bridge.

Optionally, the active layer further comprises a third semiconductor region, a fourth semiconductor region, and a plurality of additional semiconductor bridges each of which connecting the third semiconductor region and the fourth semiconductor region; the plurality of additional semiconductor bridges spaced apart from each other; the third semiconductor region comprising a third non-overlapping portion, a projection of which is outside that of the etch stop layer in plan view of the base substrate; the fourth semiconductor region comprising a fourth non-overlapping portion, a projection of which is outside that of the etch stop layer in plan view of the base substrate; the first electrode is on a side of the third non-overlapping portion distal to the base substrate; and the second electrode is on a side of the fourth non-overlapping portion distal to the base substrate.

Optionally, the third semiconductor region is an integral semiconductor block connecting a plurality of first terminus of the plurality of additional semiconductor bridges; the fourth semiconductor region is an integral semiconductor block connecting a plurality of second terminus of the plurality of additional semiconductor bridges.

Optionally, the first electrode is in contact with the third non-overlapping portion, and the second electrode is in contact with the fourth non-overlapping portion.

Optionally, the etch stop layer comprises a plurality of additional etch stop blocks spaced apart from each other, each additional etch stop block at least partially overlapping with corresponding additional semiconductor bridge.

Optionally, the first electrode comprises a first electrode main body, a plurality of first electrode teeth integral with the first electrode main body and extending from the first electrode main body toward free ends of the plurality of first electrode teeth; the second electrode comprises a second electrode main body, a plurality of second electrode teeth integral with the second electrode main body and extending from the second electrode main body toward free ends of the plurality of second electrode teeth; each of the plurality of first electrode teeth and each of the plurality of second electrode teeth are alternately arranged and spaced apart so that the first electrode and the second electrode are interleaving; the first non-overlapping portion and the third non-overlapping portion are on a side of the plurality of first electrode teeth proximal to the base substrate, the second non-overlapping portion and the fourth non-overlapping portion are on a side of the plurality of second electrode teeth proximal to the base substrate.

Optionally, the first electrode comprises a first electrode main body, two first electrode teeth integral with the first electrode main body and extending from the first electrode main body toward free ends of the two first electrode teeth; the second electrode comprises a second electrode main body, two second electrode teeth integral with the second electrode main body and extending from the second electrode main body toward free ends of the two second electrode teeth; the two first electrode teeth are sandwiched by the two second electrode teeth so that one of the two second electrode teeth is on one side of the two first electrode teeth and another of the two second electrode teeth is on an opposite side of the two first electrode teeth, and the two first electrode teeth are in the middle; the first non-overlapping portion and the third non-overlapping portion are on a side of the two first electrode teeth proximal to the base substrate, the second non-overlapping portion and the fourth non-overlapping portion are on a side of the two second electrode teeth proximal to the base substrate.

Optionally, the first electrode comprises an integral first electrode block; the second electrode comprises a second electrode main body, two second electrode teeth integral with the second electrode main body and extending from the second electrode main body toward free ends of the two second electrode teeth; the integral first electrode block is sandwiched by the two second electrode teeth so that one of the two second electrode teeth is on one side of the integral first electrode block and another of the two second electrode teeth is on an opposite side of the integral first electrode block, and the integral first electrode block is in the middle; the first non-overlapping portion and the third non-overlapping portion are on a side of the integral first electrode block proximal to the base substrate, the second non-overlapping portion and the fourth non-overlapping portion are on a side of the two second electrode teeth proximal to the base substrate.

Optionally, the first non-overlapping portion and the third non-overlapping portion constitute an integral non-overlapping portion.

Optionally, the first semiconductor region further comprising a first overlapping portion, a projection of which overlaps with that of the etch stop layer in plan view of the base substrate; the second semiconductor region further comprising a second overlapping portion, a projection of which overlaps with that of the etch stop layer in plan view of the base substrate.

Optionally, the etch stop layer is substantially resistant to an etchant for etching the first electrode and the second electrode.

In another aspect, the present invention provides a method of fabricating a thin film transistor comprising forming an active layer on a base substrate comprising a first semiconductor region, a second semiconductor region, and a plurality of semiconductor bridges each of which connecting the first semiconductor region and the second semiconductor region; the plurality of semiconductor bridges spaced apart from each other; the active layer being made of a material comprising $M1O_aN_b$, wherein M1 is a single metal or a combination of metals, a>0, and b≥0; forming an etch stop layer on a side of the active layer distal to the base substrate; the first semiconductor region comprising a first non-overlapping portion, a projection of which is outside that of the etch stop layer in plan view of the base substrate; the second semiconductor region comprising a second non-overlapping portion, a projection of which is outside that of the etch stop layer in plan view of the base substrate; forming a first electrode on a side of the first non-overlapping portion distal to the base substrate; and forming a second electrode on a side of the second non-overlapping portion distal to the base substrate.

Optionally, the step of forming the active layer and the step of forming the etch stop layer are performed in a single patterning step.

Optionally, the single patterning step comprises forming a semiconductor material layer comprising $M1O_aN_b$, wherein M1 is a single metal or a combination of metals, a>0, and b≥0, on the base substrate; forming an etch stop material layer on a side of the semiconductor material layer distal to the base substrate; coating a photoresist layer on a side of the etch stop material layer distal to the semiconductor material layer; exposing the photoresist layer with a half-tone mask plate or a gray-tone mask plate; developing the exposed photoresist layer to obtain a photoresist pattern comprising a first section corresponding to the active layer and a second section which is outside of the first section; the first section comprising a first zone corresponding to the first non-overlapping portion and the second non-overlapping portion, and a second zone corresponding to remaining parts of the first section; the depth of the second zone is larger than that of the first zone, and the photoresist material is removed in the second section; removing the etch stop material layer in the second section; removing the semiconductor material layer in the second section thereby forming an active layer pattern corresponding to the active layer; removing the photoresist layer in the first zone while maintaining the photoresist layer in the second zone; removing the etch stop material layer in the first zone thereby forming an etch stop layer pattern corresponding to the etch stop layer; and removing the photoresist layer in the second zone.

Optionally, the step of forming the active layer, the step of forming the first electrode, and the step of forming the second electrode are performed in a single patterning step.

Optionally, the method comprising forming a semiconductor material layer comprising $M1O_aN_b$, wherein M1 is a single metal or a combination of metals, a>0, and b≥0, on the base substrate; forming an etch stop material layer on a side of the semiconductor material layer distal to the base substrate; coating a first photoresist layer on a side of the etch stop material layer distal to the semiconductor material layer; exposing the first photoresist layer with a first mask plate having a pattern corresponding to the etch stop layer; developing the exposed first photoresist layer to obtain a first photoresist pattern comprising a first section corresponding to the etch stop layer and a second section which is outside of the first section; removing the etch stop material layer in the second section thereby forming an etch stop layer pattern corresponding to the etch stop layer, forming an electrode material layer on a side of the etch stop layer and the semiconductor material layer distal to the base substrate; coating a second photoresist layer on a side of the electrode material layer distal to the base substrate; exposing the second photoresist layer with a second mask plate having a pattern corresponding to the first electrode and the second electrode; developing the exposed second photoresist layer to obtain a second photoresist pattern comprising a third section corresponding to the first electrode and the second electrode, and a fourth section which is outside of the first section; removing the electrode material layer in the fourth section thereby forming a first electrode pattern corresponding to the first electrode and a second electrode pattern corresponding to the second electrode; and removing the semiconductor material layer in the fourth section thereby forming an active layer pattern corresponding to the active layer.

In another aspect, the present invention provides a gate drive on array (GOA) circuit comprising a thin film transistor described herein or fabricated by a method described herein.

In another aspect, the present invention provides a display apparatus comprising a thin film transistor described herein or fabricated by a method described herein.

BRIEF DESCRIPTION OF THE FIGURES

The following drawings are merely examples for illustrative purposes according to various disclosed embodiments and are not intended to limit the scope of the present invention.

FIG. 1B is a diagram illustrating the structure of an active layer of a thin film transistor in some embodiments.

DETAILED DESCRIPTION

Figure 1A:
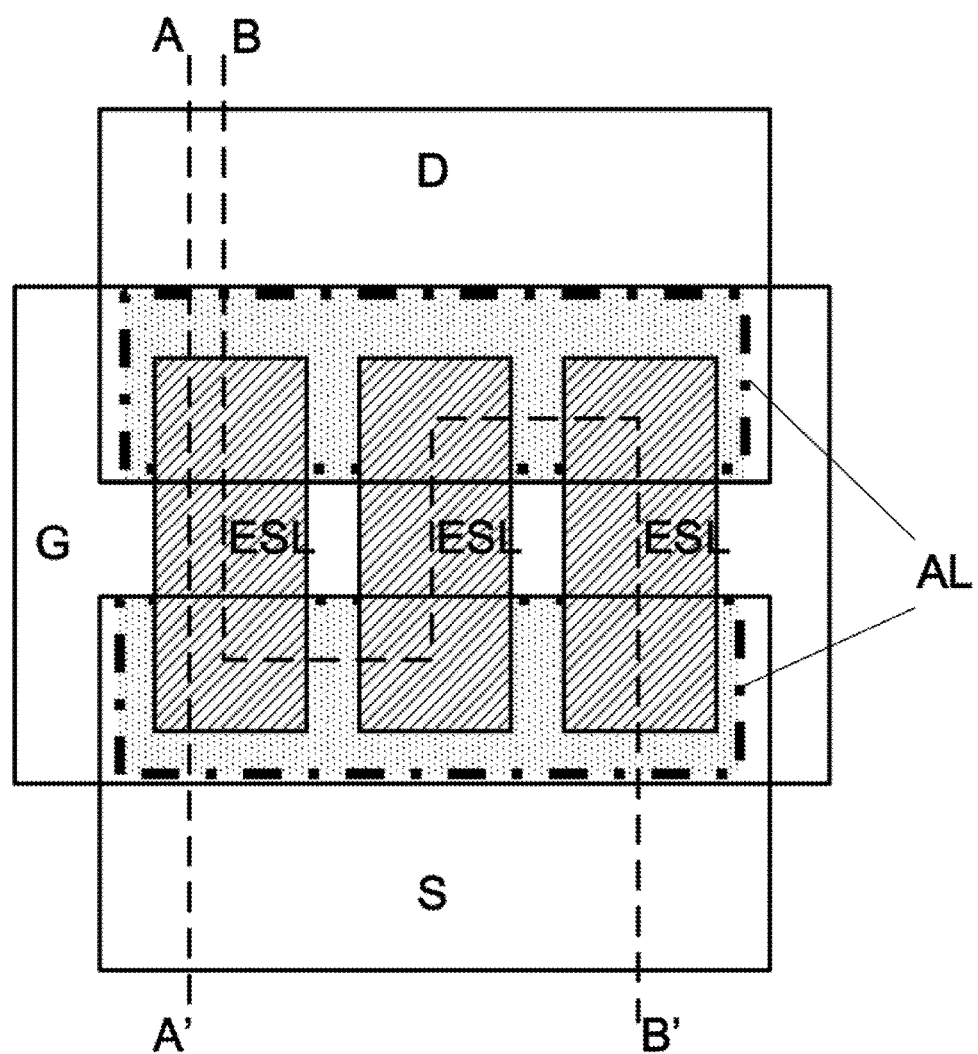
FIG. 1A is a diagram illustrating the structure of a thin film transistor in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

A major disadvantage of the conventional metal oxide or metal oxynitride thin film transistors is its thermal instability. For example, various metal oxides used in the conventional thin film transistors is not very stable at higher temperatures and may become polycrystalline under higher temperature for an elongated period of time. In the present disclosure, it is discovered that the carriers in the active layer heavily concentrates along the edges of the active layer, i.e., the carrier density along the edges of the active layer is much larger than that in the center of the active layer. Accordingly, it is discovered that it is not effective to increase the thermal stability of the thin film transistor by simply increasing the width of the semiconductor active layer. An alternative way to overcome the issue of thermal instability and increase carrier density is to use a multi-channel thin film transistor having a plurality of thin film transistors assembled in parallel. However, this type of multi-channel thin film transistor occupies a large space, leading to a reduced aperture ratio.

In one aspect, the present disclosure provides a thin film transistor and a method of fabricating the same that substantially obviates one or more of the problems due to limitations and disadvantages of the related art. In some embodiments, the thin film transistor includes a base substrate; an active layer on the base substrate having a first semiconductor region, a second semiconductor region, and a plurality of semiconductor bridges each of which connecting the first semiconductor region and the second semiconductor region. Because the carriers concentrates heavily along the edges of the semiconductor bridges, the total carrier density of the thin film transistor may be multiplied by using a plurality of semiconductor bridges. Because the plurality of semiconductor bridges are spaced apart from each other, the space between the semiconductor bridges effectively facilitates heat dissipation, preventing overheating of the thin film transistor and resulting in a much higher thermal stability.

Optionally, the thin film transistor includes 2-20 semiconductor bridges, e.g., 2-3, 2-6, 4-10, 10-15 or 15-20 semiconductor bridges.

In some embodiments, the thin film transistor further includes an etch stop layer on a side of the active layer distal to the base substrate. In some embodiments, the first semiconductor region includes a first non-overlapping portion, a projection of which is outside that of the etch stop layer in plan view of the base substrate. In some embodiments, the second semiconductor region includes a second non-overlapping portion, a projection of which is outside that of the etch stop layer in plan view of the base substrate. In some embodiments, the thin film transistor further includes a first electrode (e.g., a source electrode or a drain electrode) on a side of the first non-overlapping portion distal to the base substrate. In some embodiments, the thin film transistor further includes a second electrode (e.g., a drain electrode or a source electrode) on a side of the second non-overlapping portion distal to the base substrate.

Optionally, the first electrode (e.g., a source electrode or a drain electrode) is in contact with and on a side of the first non-overlapping portion distal to the base substrate. Optionally, the second electrode (e.g., a drain electrode or a source electrode) is in contact with and on a side of the second non-overlapping portion distal to the base substrate. Optionally, the first electrode (e.g., a source electrode or a drain electrode) is on a side of the first non-overlapping portion distal to the base substrate, and the thin film transistor further includes an ohmic contact layer between the first electrode and the first non-overlapping portion. Optionally, the second electrode (e.g., a drain electrode or a source electrode) is on a side of the second non-overlapping portion distal to the base substrate, and the thin film transistor further includes an ohmic contact layer between the second electrode and the second non-overlapping portion.

In some embodiments, the active layer is made of a material comprising $M1O_aN_b$, wherein M1 is a single metal or a combination of metals, $a>0$, and $b≥0$, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material comprising $MlO_aN_b$ doped with one or more metal element. Optionally, the active layer is made of a material comprising $MlO_aN_b$ doped with one or more non-metal element. Optionally, the active layer is made of a material comprising $MlO_aN_b$ doped with one or more metal element and one or more non-metal element.

As used herein, the term "etch stop layer" refers to a layer that prevents etching of an underlying active layer. Optionally, the etch stop layer is substantially resistant to an etchant for etching the first electrode and the second electrode (e.g., the source electrode and the drain electrode). Optionally, the etch stop layer is substantially resistant to a wet etchant for etching the first electrode and the second electrode. Optionally, the etch stop layer is made of a silicon-containing compound. Examples of silicon-containing compounds for making the etch stop layer include, but are not limited to, silicon oxide, silicon nitride, silicon oxynitride, silicon carbide, silicon oxycarbide, silicon, and silicon germanium.

In some embodiments, the first semiconductor region and the second semiconductor region are spaced apart and arranged substantially along a first direction in a first plane. Optionally, the plurality of semiconductor bridges are spaced apart from each other, each of which is arranged substantially along a second direction in a second plane. Optionally, the first plane and the second plane are substantially parallel to each other. Optionally, the first plane and the second plane are a same plane. Optionally, the plurality of semiconductor bridges are substantially parallel to each other. Optionally, the first direction is substantially perpendicular to the second direction.

The first semiconductor region may be an integral, continuous region or a discontinuous region comprising a plurality of spaced apart first semiconductor blocks. Similarly, the second semiconductor region may be an integral, continuous region or a discontinuous region comprising a plurality of spaced apart second semiconductor blocks. In some embodiments, the first semiconductor region is an integral semiconductor block connecting a plurality of first terminus of the plurality of semiconductor bridges; and the second semiconductor region is an integral semiconductor block connecting a plurality of second terminus of the plurality of semiconductor bridges. In some embodiments, the first semiconductor region includes a plurality of first semiconductor blocks spaced apart from each other; and the second semiconductor region includes a plurality of second semiconductor blocks spaced apart from each other. Optionally, each semiconductor bridge connects corresponding first semiconductor block and corresponding second semiconductor block.

In some embodiments, the first semiconductor region is an integral semiconductor block connecting a plurality of first terminus of the plurality of semiconductor bridges; and the second semiconductor region includes a plurality of second semiconductor blocks spaced apart from each other. Optionally, each semiconductor bridge connects each second semiconductor block with the integral first semiconductor block.

In some embodiments, the second semiconductor region is an integral semiconductor block connecting a plurality of second terminus of the plurality of semiconductor bridges; and the first semiconductor region includes a plurality of first semiconductor blocks spaced apart from each other. Optionally, each semiconductor bridge connects each first semiconductor block with the integral second semiconductor block.

In some embodiments, the active layer is an integral active layer, i.e., the first semiconductor region is an integral semiconductor block connecting a plurality of first terminus of the plurality of semiconductor bridges; and the second semiconductor region is an integral semiconductor block connecting a plurality of second terminus of the plurality of semiconductor bridges.

In some embodiments, the first semiconductor region consists of a first non-overlapping portion, a projection of which is outside that of the etch stop layer in plan view of the base substrate. In some embodiments, the second semiconductor region consists of a second non-overlapping portion, a projection of which is outside that of the etch stop layer in plan view of the base substrate. Optionally, the first semiconductor region consists of a first non-overlapping portion, a projection of which is outside that of the etch stop layer in plan view of the base substrate; and the second semiconductor region consists of a second non-overlapping portion, a projection of which is outside that of the etch stop layer in plan view of the base substrate.

In some embodiments, the first semiconductor region includes a first non-overlapping portion, a projection of which is outside that of the etch stop layer in plan view of the base substrate; and a first overlapping portion, a projection of which overlaps with that of the etch stop layer in plan view of the base substrate. In some embodiments, the second semiconductor region includes a second non-overlapping portion, a projection of which is outside that of the etch stop layer in plan view of the base substrate; and a second overlapping portion, a projection of which overlaps with that of the etch stop layer in plan view of the base substrate. Optionally, the first semiconductor region includes a first non-overlapping portion, a projection of which is outside that of the etch stop layer in plan view of the base substrate; and a first overlapping portion, a projection of which overlaps with that of the etch stop layer in plan view of the base substrate; and the second semiconductor region includes a second non-overlapping portion, a projection of which is outside that of the etch stop layer in plan view of the base substrate; and a second overlapping portion, a projection of which overlaps with that of the etch stop layer in plan view of the base substrate.

In some embodiments, the present thin film transistor has a structure that further facilitates heat dissipation when the thin film transistor includes a large number of semiconductor bridges. Specifically, in some embodiments, the active layer of the thin film transistor further may further include a third semiconductor region, a fourth semiconductor region, and a plurality of additional semiconductor bridges each of which connecting the third semiconductor region and the fourth semiconductor region. The plurality of additional semiconductor bridges are spaced apart from each other. The third semiconductor region includes a third non-overlapping portion, and the fourth semiconductor region includes a fourth non-overlapping portion. The projections of the third non-overlapping portion and the fourth non-overlapping portion are outside that of the etch stop layer in plan view of the base substrate. The first electrode (e.g., a source electrode or a drain electrode) is on a side of the third non-overlapping portion distal to the base substrate. The second electrode (e.g., a drain electrode or a source electrode) is on a side of the fourth non-overlapping portion distal to the base substrate.

Optionally, the thin film transistor includes 2-20 additional semiconductor bridges, e.g., 2-3, 2-6, 4-10, 10-15 or 15-20 additional semiconductor bridges.

Optionally, the first electrode (e.g., a source electrode or a drain electrode) is in contact with and on a side of the third non-overlapping portion distal to the base substrate. Optionally, the second electrode (e.g., a drain electrode or a source electrode) is in contact with and on a side of the fourth non-overlapping portion distal to the base substrate. Optionally, the first electrode (e.g., a source electrode or a drain electrode) is on a side of the third non-overlapping portion distal to the base substrate, and the thin film transistor further includes an ohmic contact layer between the first electrode and the third non-overlapping portion. Optionally, the second electrode (e.g., a drain electrode or a source electrode) is on a side of the fourth non-overlapping portion distal to the base substrate, and the thin film transistor further includes an ohmic contact layer between the second electrode and the fourth non-overlapping portion.

In some embodiments, the third semiconductor region and the fourth semiconductor region are spaced apart and arranged substantially along a third direction in a third plane. Optionally, the plurality of semiconductor bridges are spaced apart from each other, each of which is arranged substantially along a fourth direction in a fourth plane. Optionally, the third plane and the fourth plane are substantially parallel to each other. Optionally, the third plane and the fourth plane are a same plane. Optionally, the plurality of additional semiconductor bridges are substantially parallel to each other. Optionally, the third direction is substantially perpendicular to the fourth direction. Optionally, the first plane, the second plane, the third plane and the fourth plane are a same plane.

The third semiconductor region may be an integral, continuous region or a discontinuous region comprising a plurality of spaced apart third semiconductor blocks. Similarly, the fourth semiconductor region may be an integral, continuous region or a discontinuous region comprising a plurality of spaced apart fourth semiconductor blocks. In some embodiments, the third semiconductor region is an integral semiconductor block connecting a plurality of first terminus of the plurality of additional semiconductor bridges; and the fourth semiconductor region is an integral semiconductor block connecting a plurality of second terminus of the plurality of additional semiconductor bridges. In some embodiments, the third semiconductor region includes a plurality of third semiconductor blocks spaced apart from each other; and the fourth semiconductor region includes a plurality of fourth semiconductor blocks spaced apart from each other. Optionally, each additional semiconductor bridge connects corresponding third semiconductor block and corresponding fourth semiconductor block. In some embodiments, the third semiconductor region is an integral semiconductor block connecting a plurality of first terminus of the plurality of additional semiconductor bridges; and the fourth semiconductor region includes a plurality of fourth semiconductor blocks spaced apart from each other. Optionally, each additional semiconductor bridge connects each fourth semiconductor block with the integral third semiconductor block. In some embodiments, the fourth semiconductor region is an integral semiconductor block connecting a plurality of second terminus of the plurality of additional semiconductor bridges; and the third semiconductor region includes a plurality of third semiconductor blocks spaced apart from each other. Optionally, each additional semiconductor bridge connects each third semiconductor block with the integral fourth semiconductor block.

In some embodiments, the third semiconductor region consists of a third non-overlapping portion, a projection of which is outside that of the etch stop layer in plan view of the base substrate. In some embodiments, the fourth semiconductor region consists of a fourth non-overlapping portion, a projection of which is outside that of the etch stop layer in plan view of the base substrate. Optionally, the third semiconductor region consists of a third non-overlapping portion, a projection of which is outside that of the etch stop layer in plan view of the base substrate; and the fourth semiconductor region consists of a fourth non-overlapping portion, a projection of which is outside that of the etch stop layer in plan view of the base substrate.

In some embodiments, the etch stop layer includes a plurality of etch stop blocks spaced apart from each other. Optionally, each etch stop block at least partially overlaps with corresponding semiconductor bridge, e.g., each etch stop block substantially overlaps with corresponding semiconductor bridge. Optionally, each etch stop block at least partially overlaps with corresponding additional semiconductor bridge, e.g., each etch stop block substantially overlaps with corresponding additional semiconductor bridge.

In some embodiments, the etch stop layer at least partially overlaps with the first semiconductor region. For example, each etch stop block at least partially overlaps with the first semiconductor region. In some embodiments, the etch stop layer at least partially overlaps with the second semiconductor region. For example, each etch stop block at least partially overlaps with the second semiconductor region. Optionally, the etch stop layer at least partially overlaps with the first semiconductor region and the second semiconductor region. For example, each etch stop block at least partially overlaps with the first semiconductor region and the second semiconductor region. In some embodiments, the etch stop layer does not overlap with the first semiconductor region. In some embodiments, the etch stop layer does not overlap with the second semiconductor region. Optionally, the etch stop layer does not overlap with the first semiconductor region or the second semiconductor region.

Similarly, in some embodiments, the etch stop layer at least partially overlaps with the third semiconductor region. For example, each etch stop block at least partially overlaps with the third semiconductor region. In some embodiments, the etch stop layer at least partially overlaps with the fourth semiconductor region. For example, each etch stop block at least partially overlaps with the fourth semiconductor region. Optionally, the etch stop layer at least partially overlaps with the third semiconductor region and the fourth semiconductor region. For example, each etch stop block at least partially overlaps with the third semiconductor region and the fourth semiconductor region. In some embodiments, the etch stop layer does not overlap with the third semiconductor region. In some embodiments, the etch stop layer does not overlap with the fourth semiconductor region. Optionally, the etch stop layer does not overlap with the third semiconductor region or the fourth semiconductor region.

Various embodiments may be practiced to make and use the present thin film transistor. In some embodiments, the plurality of semiconductor bridges (or the plurality of additional semiconductor bridges) are spaced apart from each other by a distance in the range of about 3 μm to about 15

µm, e.g., about 3 µm to about 5 µm, about 5 µm to about 10 µm, and about 10 µm to about 15 µm. In some embodiments, each of the plurality of semiconductor bridges (or the plurality of additional semiconductor bridges) has a width in the range of about 3 µm to about 20 µm, e.g., 3 µm to about 5 µm, 5 µm to about 10 µm, 10 µm to about 15 µm, and 15 µm to about 20 µm.

The semiconductor bridges may be made in any appropriate shapes. Examples of semiconductor bridge shapes include, but are not limited to, a rectangular shape, a square shape, an elliptical shape, a circle shape, a diamond shape, and an oval shape. In some embodiments, the semiconductor bridge includes a middle portion having concaved-shaped lateral edges and a width narrower than widths of other portions of the each semiconductor bridge. The concaved-shaped lateral edges may be curve lines, e.g., an arc. The concaved-shaped lateral edges may be a plurality of straight lines. For example, the semiconductor bridge may include an inverted trapezoid stacked on top of a trapezoid.

The first, second, third, or fourth semiconductor region, and the first, second, third, fourth semiconductor blocks, may be made in any appropriate shapes, examples of which include, but are not limited to, a rectangular shape, a square shape, an elliptical shape, a circle shape, a diamond shape, an oval shape, a parallelogram shape, a rhombus shape, and a hexagon shape.

In some embodiments, the thin film transistor is a bottom-gate type thin film transistor. For examples, the thin film transistor may further include a gate electrode on a side of the active layer proximal to the base substrate, and a gate insulating layer between the active layer and the gate electrode. Accordingly, in some embodiments, the bottom-gate type thin film transistor includes a gate electrode on the base substrate, a gate insulating layer on a side of the gate electrode distal to the base substrate, an active layer on a side of the gate insulating layer distal to the gate electrode, an etch stop layer on a side of the active layer distal to the gate insulating layer, and a first electrode and a second electrode on a side of the active layer distal to the gate insulating layer (and optionally in contact with the active layer). Specifically, the first electrode may be on a side of the first non-overlapping portion distal to the gate insulating layer (and optionally in contact with the first non-overlapping portion), and the second electrode may be on a side of the second non-overlapping portion distal to the gate insulating layer (and optionally in contact with the second non-overlapping portion).

FIG. 1A is a diagram illustrating the structure of a thin film transistor in some embodiments. Referring to FIG. 1A, the thin film transistor in the embodiment includes a source electrode S, a drain electrode D, a gate electrode G, an active layer AL, and an etch stop layer ESL on a side of the active layer distal to the gate electrode including a plurality of etch stop blocks spaced apart from each other. The thin film transistor in FIG. 1A is a bottom-gate type thin film transistor.

FIG. 1B is a diagram illustrating the structure of an active layer of a thin film transistor in some embodiments. In FIG. 1B, the etch stop layer is not shown so that the structure of the active layer is revealed. Referring to FIG. 1B, the active layer AL in the embodiment includes a first semiconductor region AL-1, a second semiconductor region AL-2, and a plurality of semiconductor bridges AL-B each of which connecting the first semiconductor region Al-1 and the second semiconductor region AL-2.

Figure 1C:
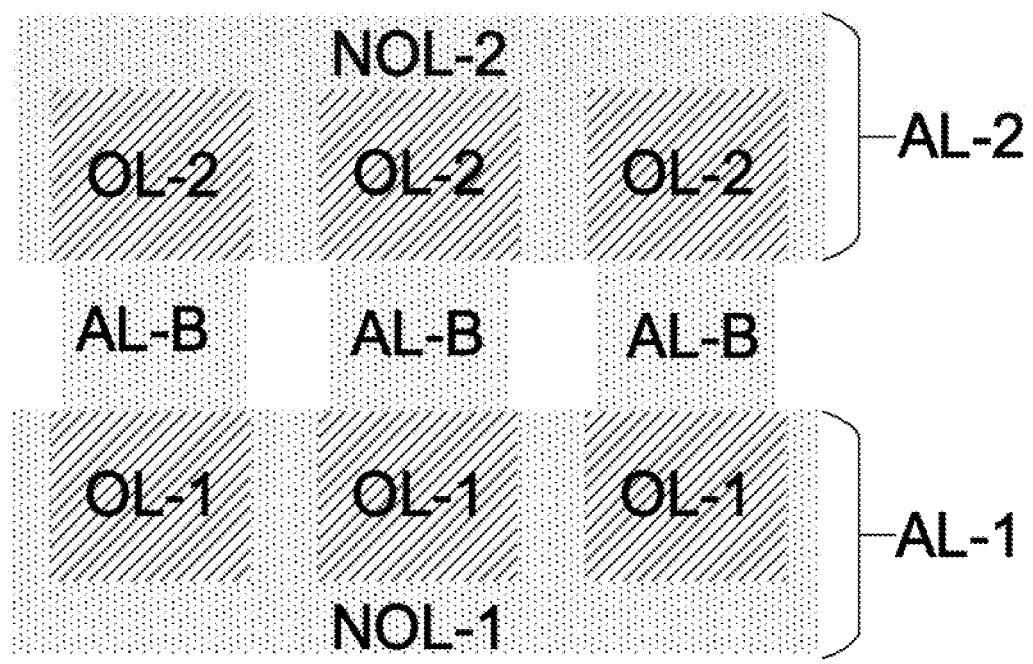
FIG. 1C is a diagram illustrating the structure of an active layer of a thin film transistor in some embodiments.

FIG. 1C is a diagram illustrating the structure of an active layer of a thin film transistor in some embodiments. Referring to FIG. 1C, the first semiconductor region AL-1 in the embodiment includes a first non-overlapping portion NOL-1, a projection of which is outside that of the etch stop layer in plan view of the base substrate, and a second semiconductor region AL-2 in the embodiment includes a second non-overlapping portion NOL-2, a projection of which is outside that of the etch stop layer in plan view of the base substrate. Optionally, as shown in FIG. 1C, the first semiconductor region AL-1 further includes one or more first overlapping portion OL-1, a projection of which overlaps with that of the etch stop layer in plan view of the base substrate; and the second semiconductor region AL-2 further includes one or more second overlapping portion OL-2, a projection of which overlaps with that of the etch stop layer in plan view of the base substrate.

Referring to FIGS. 1A-1C, the etch stop layer ESL is on a side of the active layer AL distal to the gate electrode G. Each etch stop block overlaps with corresponding semiconductor bridge AL-B (so that the semiconductor bridges AL-B is not shown in FIG. 1A). The thin film transistor in FIGS. 1A-1C further includes a source electrode S in contact with and on a side of the first non-overlapping portion NOL-1 distal to the base substrate and a drain electrode D in contact with and on a side of the second non-overlapping portion NOL-2 distal to the base substrate.

As shown in FIG. 1B, the active layer AL in the embodiment is an integral layer. For example, the integral active layer in FIG. 1B includes a first semiconductor region AL-1 which is an integral semiconductor block connecting a plurality of first terminus of the plurality of semiconductor bridges AL-B, and a second semiconductor region AL-2 which is an integral semiconductor block connecting a plurality of second terminus of the plurality of semiconductor bridges AL-B.

Figure 1D:
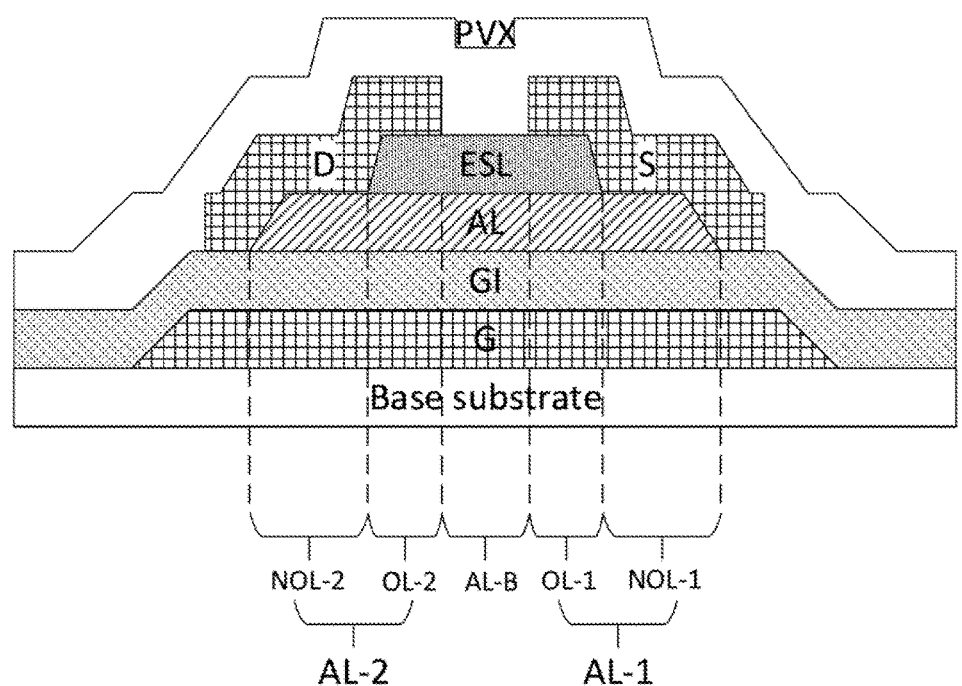
FIG. 1D is a cross-sectional view along line A-A' of the thin film transistor in FIG. 1A.
Figure 1E:
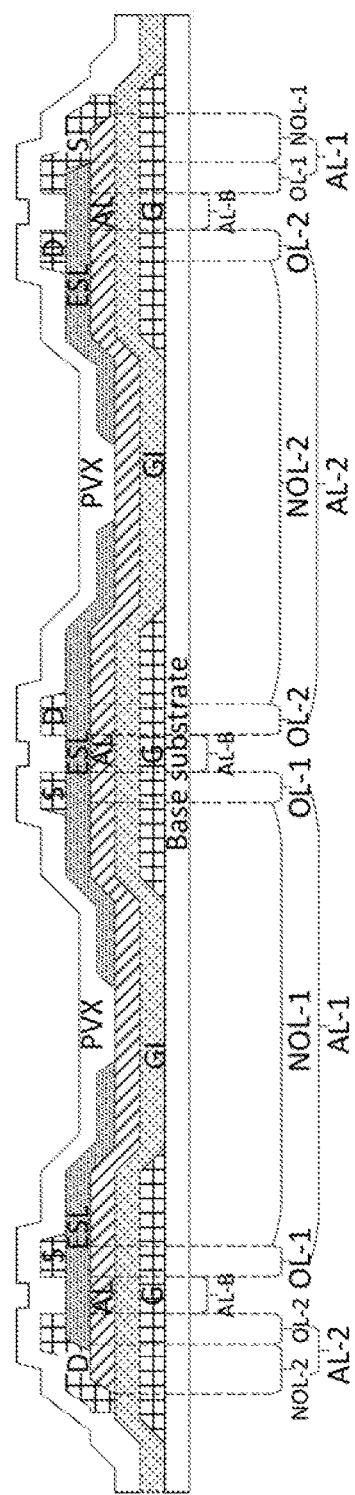
FIG. 1E is a cross-sectional view along line B-B' of the thin film transistor in FIG. 1A.

FIG. 1D is a cross-sectional view along line A-A' of the thin film transistor in FIG. 1A. FIG. 1E is a cross-sectional view along line B-B' of the thin film transistor in FIG. 1A. Referring to FIGS. 1D-1E, the thin film transistor in the embodiment includes a gate electrode G on a Base substrate, a gate insulating layer GI on a side of the gate electrode G distal to the Base substrate, an active layer AL on a side of the gate insulating layer GI distal to the gate electrode G, an etch stop layer ESL on a side of the active layer AL distal to the gate insulating layer GI, and a source electrode S and a drain electrode D on a side of the active layer AL distal to the gate insulating layer GI. As shown in FIGS. 1D-1E, the active layer AL partially overlaps with the etch stop layer ESL and partially overlaps with and is in contact with the source electrode S and the drain electrode D, in plan view of the base substrate. As discussed herein throughout, the active layer AL includes a first semiconductor region AL-1, a second semiconductor region AL-2, and a plurality of semiconductor bridges AL-B. The area where the active layer AL overlaps with the etch stop layer ESL includes an area corresponding to the plurality of the semiconductor bridges AL-B, a portion of the first semiconductor region (i.e., the first overlapping portion OL-1), and a portion of the second semiconductor region (i.e., the second overlapping portion OL-2). The area where the active layer overlaps with (and optionally in contact with) the source electrode is the first non-overlapping portion NOL-1, and the area where the active layer overlaps with (and optionally in contact with) the drain electrode is the second non-overlapping portion NOL-2.

As shown in FIG. 1E, the first semiconductor region AL-1 in the embodiment is an integral semiconductor block connecting a plurality of first terminus of the plurality of semiconductor bridges AL-B, and the second semiconductor region AL-2 is an integral semiconductor block connecting a plurality of second terminus of the plurality of semiconductor bridges AL-B.

Referring to FIGS. 1A-1B, the active layer AL in the embodiment include three semiconductor bridges AL-B, and the etch stop layer ESL includes three etch stop blocks, which corresponds to three semiconductor bridges AL-B in a one-to-one correspondence.

Figure 2A:
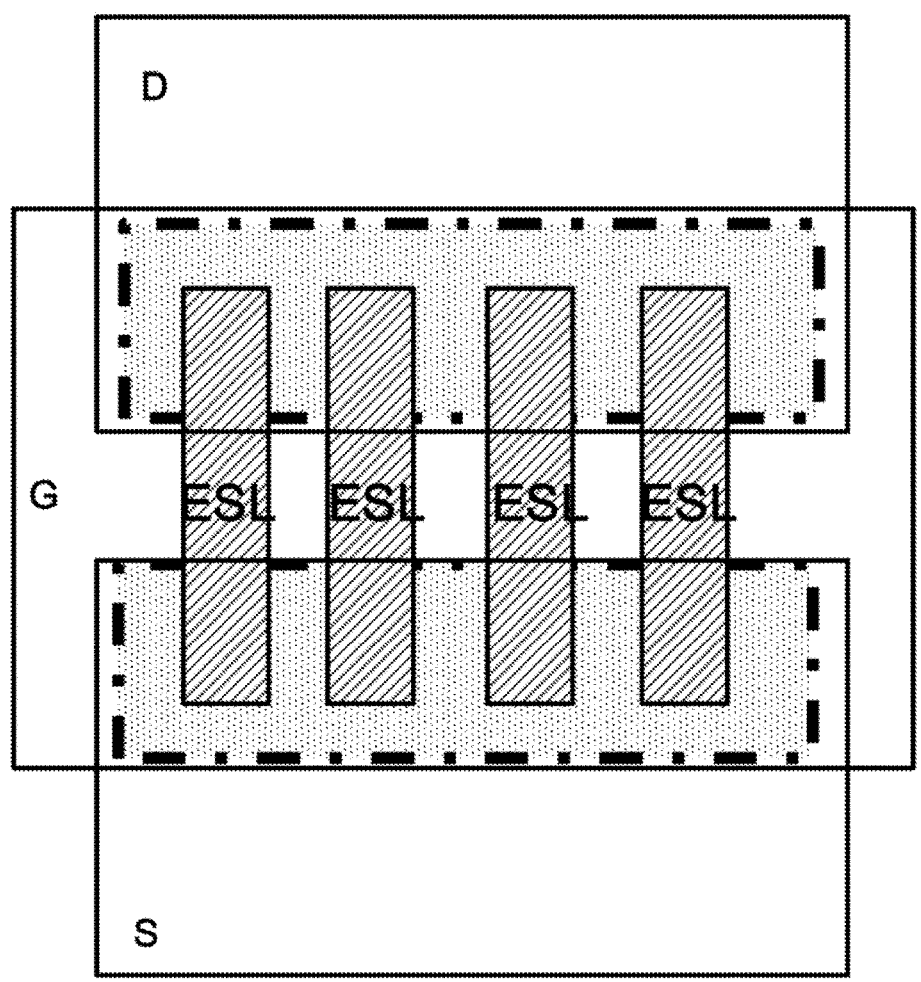
FIG. 2A is a diagram illustrating the structure of a thin film transistor in some embodiments.
Figure 2B:
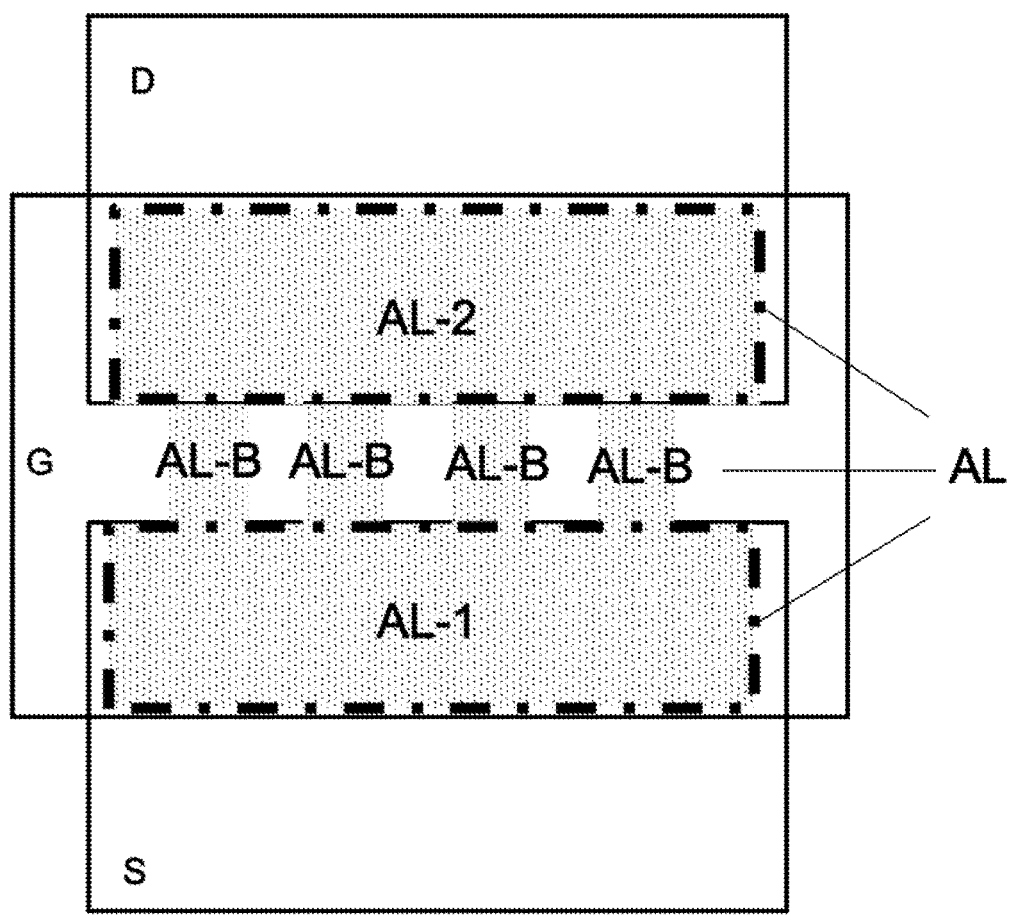
FIG. 2B is a diagram illustrating the structure of an active layer of a thin film transistor in some embodiments.

FIG. 2A is a diagram illustrating the structure of a thin film transistor in some embodiments. FIG. 2B is a diagram illustrating the structure of an active layer of a thin film transistor in some embodiments. Referring to FIGS. 2A-2B, the active layer in the embodiment include four semiconductor bridges AL-B, and the etch stop layer ESL includes four etch stop blocks, which corresponds to four semiconductor bridges AL-B in a one-to-one correspondence.

Figure 3A:
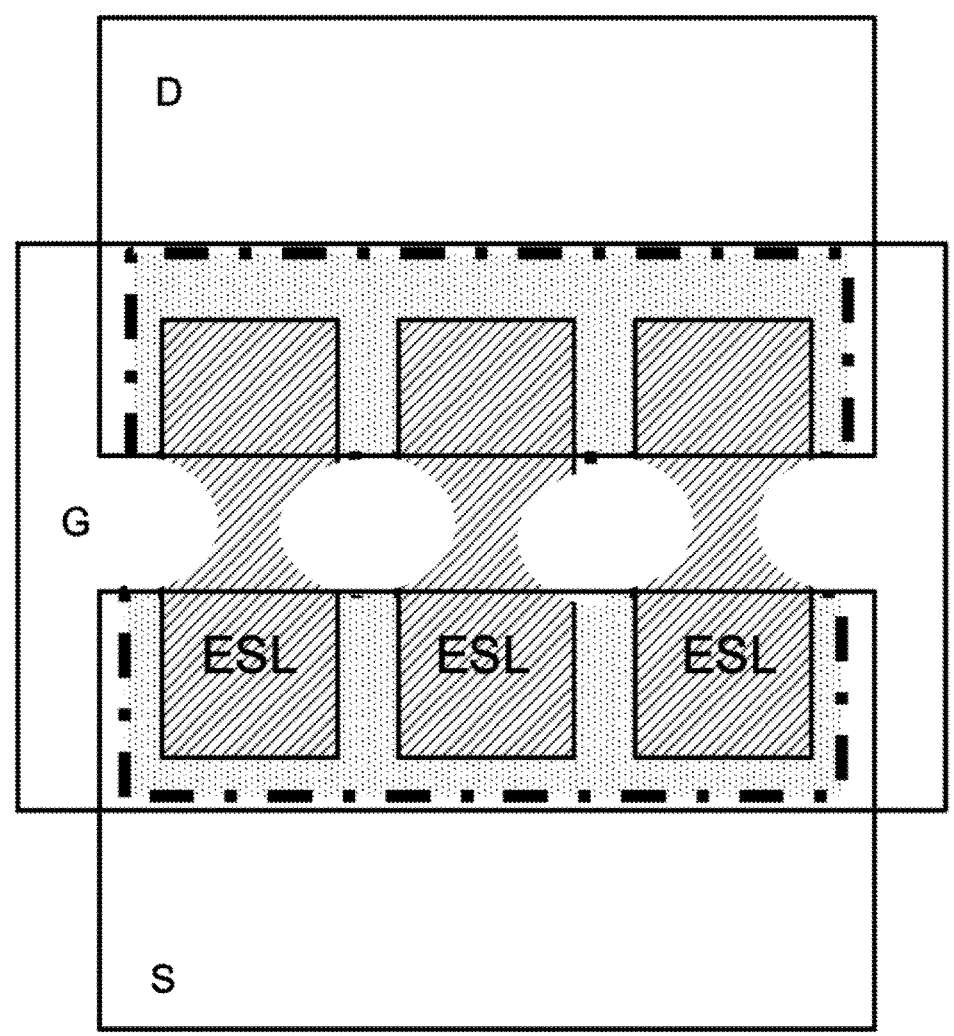
FIG. 3A is a diagram illustrating the structure of a thin film transistor in some embodiments.
Figure 3B:
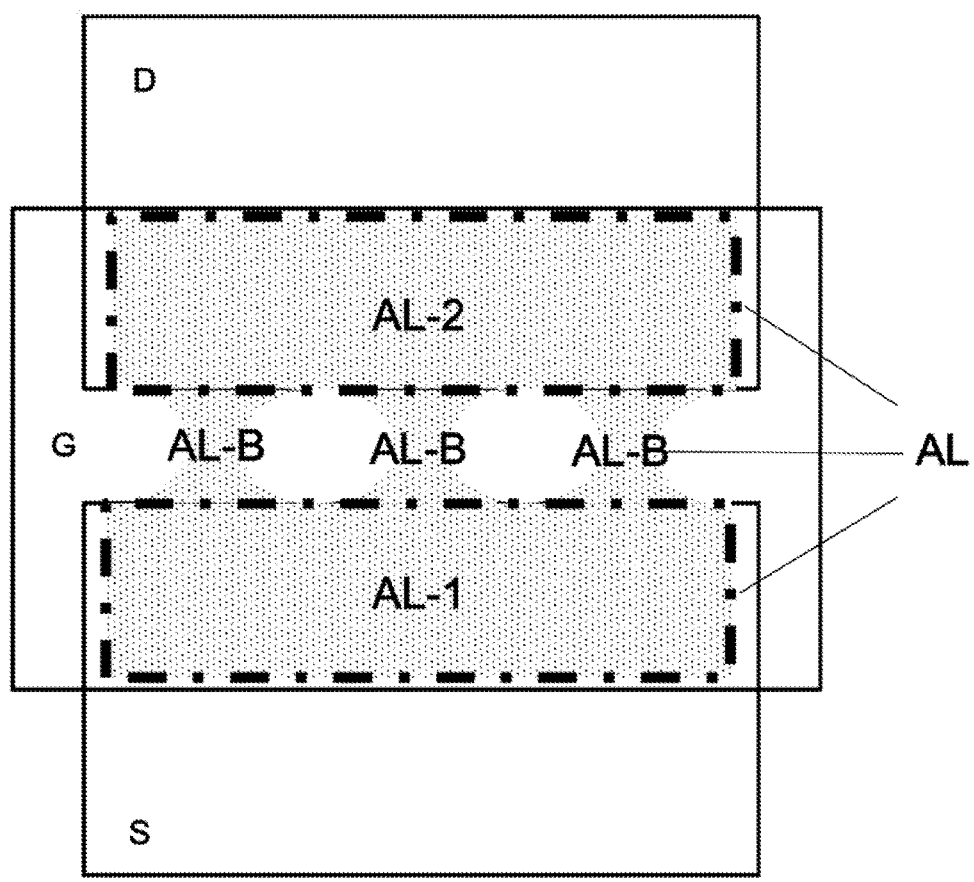
FIG. 3B is a diagram illustrating the structure of an active layer of a thin film transistor in some embodiments.

FIG. 3A is a diagram illustrating the structure of a thin film transistor in some embodiments. FIG. 3B is a diagram illustrating the structure of an active layer of a thin film transistor in some embodiments. Referring to FIGS. 3A-3B, the semiconductor bridge AL-B in the embodiment includes a middle portion having concaved-shaped lateral edges and a width narrower than widths of other portions of the semiconductor bridge AL-B. Optionally, each etch stop block has a shape corresponding to that of the semiconductor bridge AL-B. Referring to FIG. 3A, the etch stop block in the embodiment includes a middle portion having concaved-shaped lateral edges and a width narrower than widths of other portions of the etch stop block. Optionally, the semiconductor bridge AL-B includes a portion having an hourglass shape. Optionally, the etch stop block includes a portion having an hourglass shape.

Figure 4A:
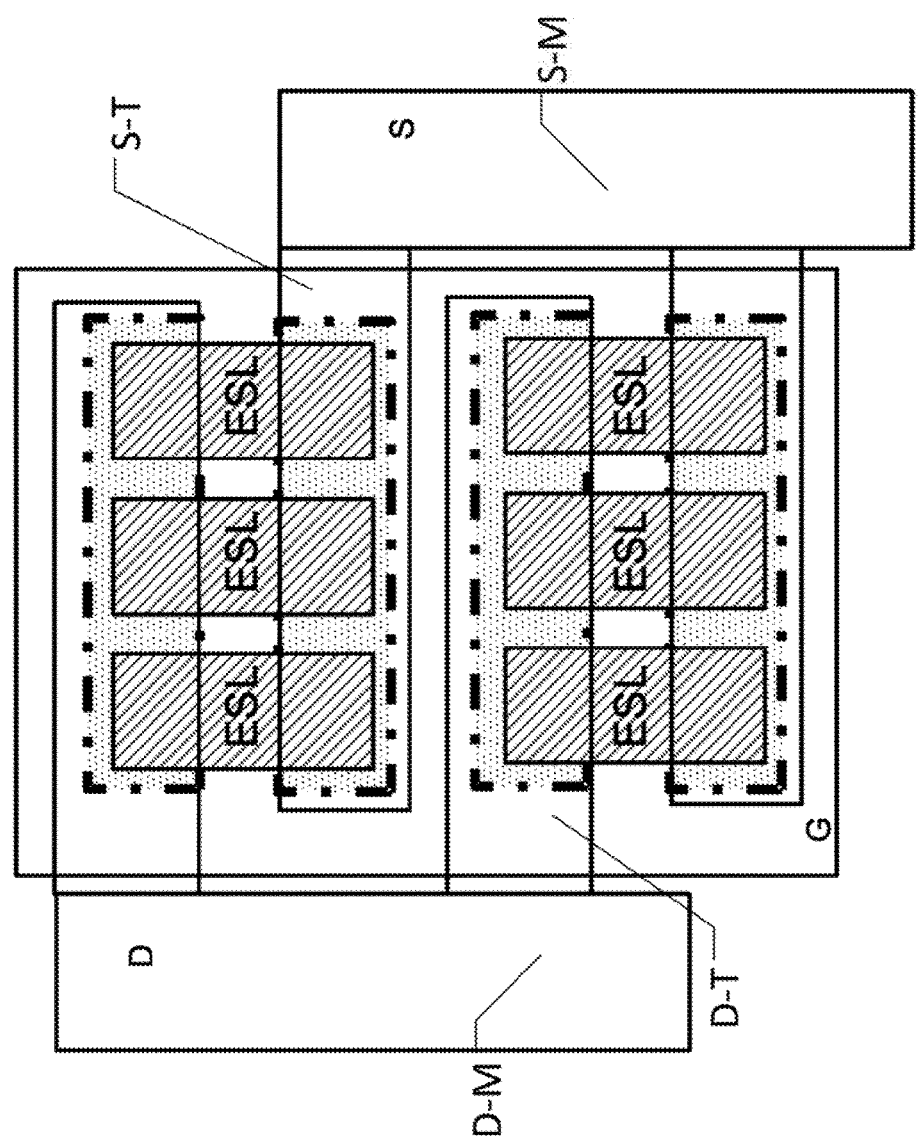
FIG. 4A is a diagram illustrating the structure of a thin film transistor in some embodiments.
Figure 4B:
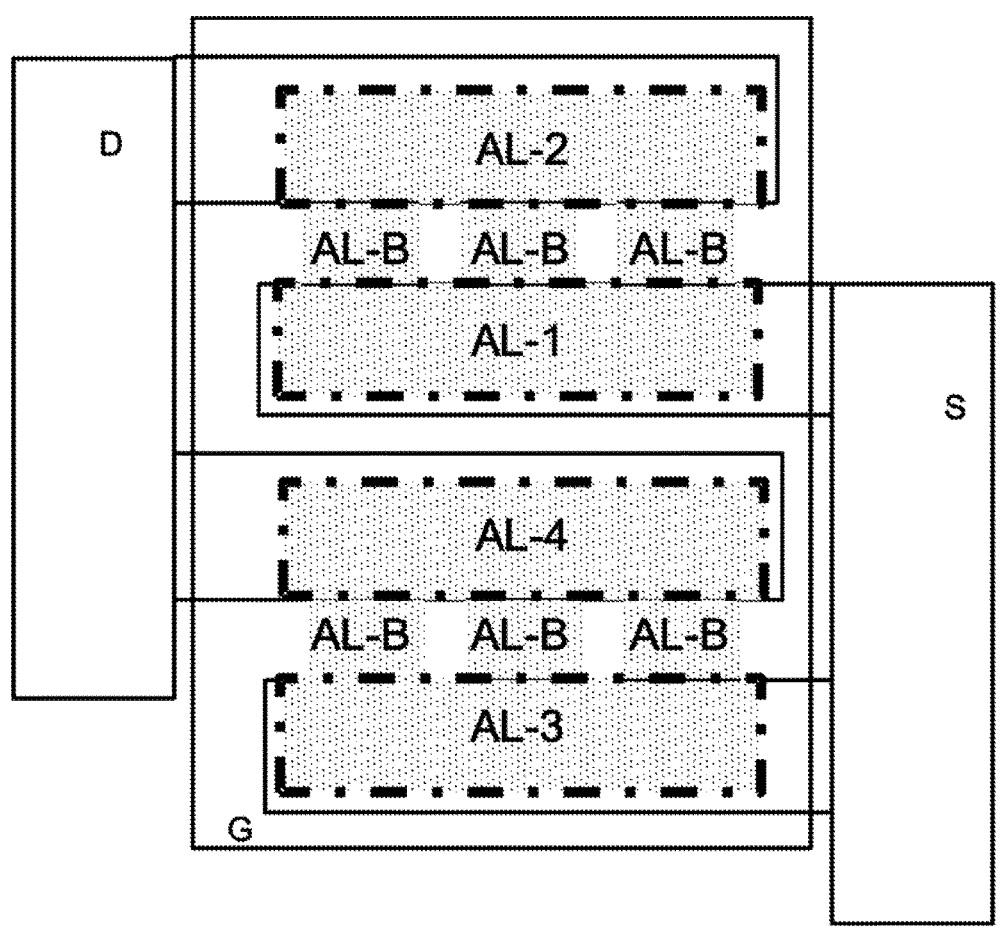
FIG. 4B is a diagram illustrating the structure of an active layer of a thin film transistor in some embodiments.

FIG. 4A is a diagram illustrating the structure of a thin film transistor in some embodiments. FIG. 4B is a diagram illustrating the structure of an active layer of a thin film transistor in some embodiments. Referring to FIGS. 4A-4B, the source electrode S in the embodiment includes a source electrode main body S-M, a plurality of (e.g., two) source electrode teeth S-T integral with the source electrode main body and extending from the source electrode main body toward free ends of the plurality of source electrode teeth. The drain electrode D in the embodiment includes a drain electrode main body D-M, a plurality of (e.g., two) drain electrode teeth D-T integral with the drain electrode main body and extending from the drain electrode main body toward free ends of the plurality of drain electrode teeth. Each of the plurality of source electrode teeth and each of the plurality of drain electrode teeth are alternately arranged and spaced apart so that the source electrode and the drain electrode are interleaving.

Referring to FIG. 4B, the active layer in the embodiment further includes a third semiconductor region AL-3, a fourth semiconductor region AL-4, and a plurality of additional semiconductor bridges AL-B each of which connecting the third semiconductor region AL-3 and the fourth semiconductor region AL-4. As shown in FIG. 4B, the plurality of additional semiconductor bridges AL-B are spaced apart from each other. Optionally, the plurality of additional semiconductor bridges AL-B are substantially parallel to each other.

Figure 4C:
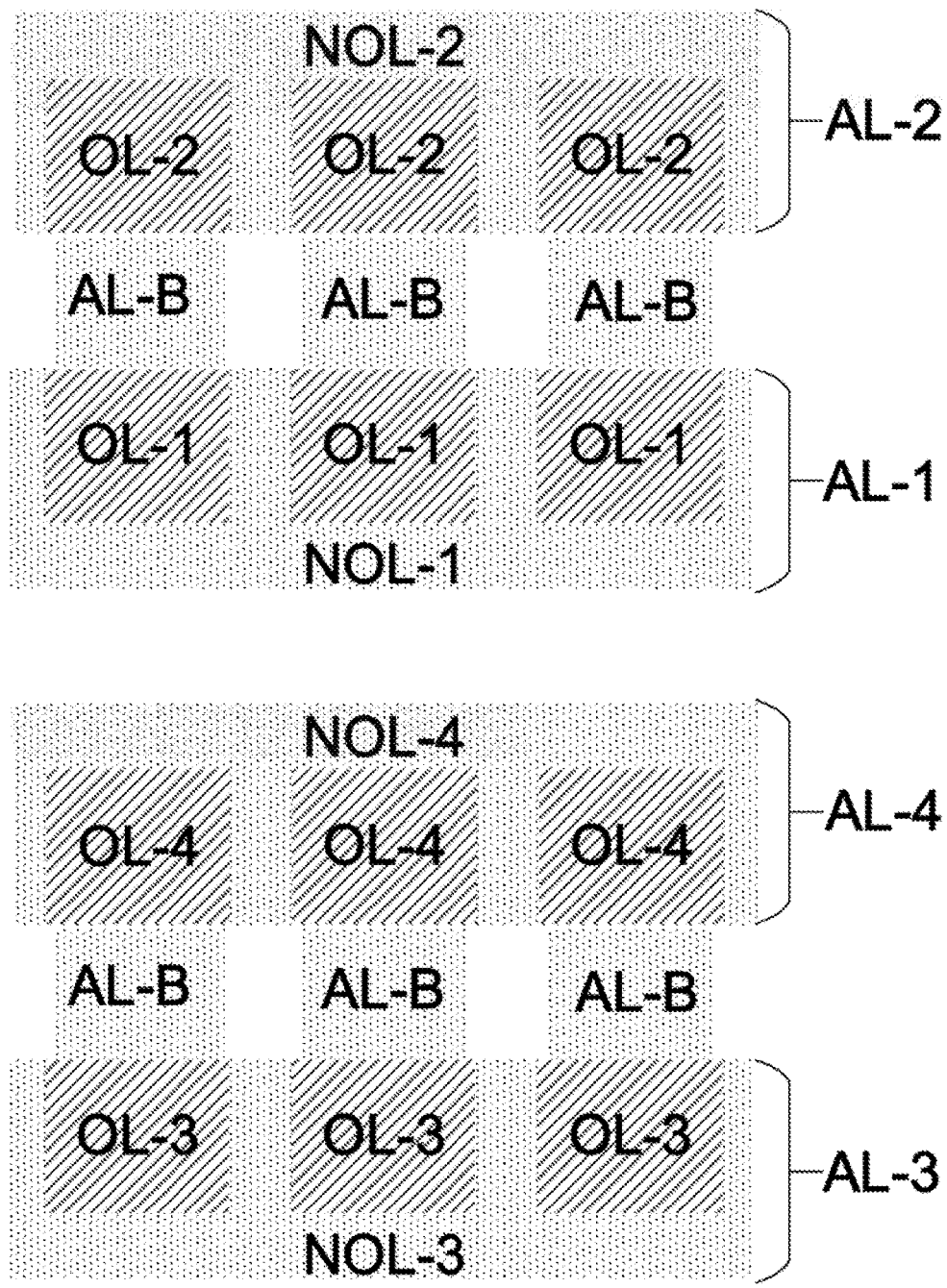
FIG. 4C is a diagram illustrating the structure of an active layer of a thin film transistor in some embodiments.

FIG. 4C is a diagram illustrating the structure of an active layer of a thin film transistor in some embodiments. Referring to FIG. 4C, the first semiconductor region AL-1 in the embodiment includes a first non-overlapping portion NOL-1, a projection of which is outside that of the etch stop layer in plan view of the base substrate, the second semiconductor region AL-2 in the embodiment includes a second non-overlapping portion NOL-2, a projection of which is outside that of the etch stop layer in plan view of the base substrate; the third semiconductor region AL-3 in the embodiment includes a third non-overlapping portion NOL-3, a projection of which is outside that of the etch stop layer in plan view of the base substrate, and the fourth semiconductor region AL-4 in the embodiment includes a fourth non-overlapping portion NOL-4, a projection of which is outside that of the etch stop layer in plan view of the base substrate. Optionally, as shown in FIG. 4C, the first semiconductor region AL-1 further includes one or more first overlapping portion OL-1, a projection of which overlaps with that of the etch stop layer in plan view of the base substrate: the second semiconductor region AL-2 further includes one or more second overlapping portion OL-2, a projection of which overlaps with that of the etch stop layer in plan view of the base substrate; the third semiconductor region AL-3 further includes one or more third overlapping portion OL-3, a projection of which overlaps with that of the etch stop layer in plan view of the base substrate, and the fourth semiconductor region AL-4 further includes one or more fourth overlapping portion OL-4, a projection of which overlaps with that of the etch stop layer in plan view of the base substrate.

Referring to FIGS. 4A-4C, the source electrode S in the embodiment is in contact with and on a side of the first non-overlapping portion NOL-1 and the third non-overlapping portion NOL-3 distal to the base substrate, the drain electrode D in the embodiment is in contact with and on a side of the second non-overlapping portion NOL-2 and the fourth non-overlapping portion NOL-4 distal to the base substrate. Specifically, the first non-overlapping portion NOL-1 and the third non-overlapping portion NOL-3 are in contact with and on a side of the plurality of source electrode teeth proximal to the base substrate, and the second non-overlapping portion NOL-2 and the fourth non-overlapping portion NOL-4 are on a side of the plurality of drain electrode teeth proximal to the base substrate.

Figure 5A:
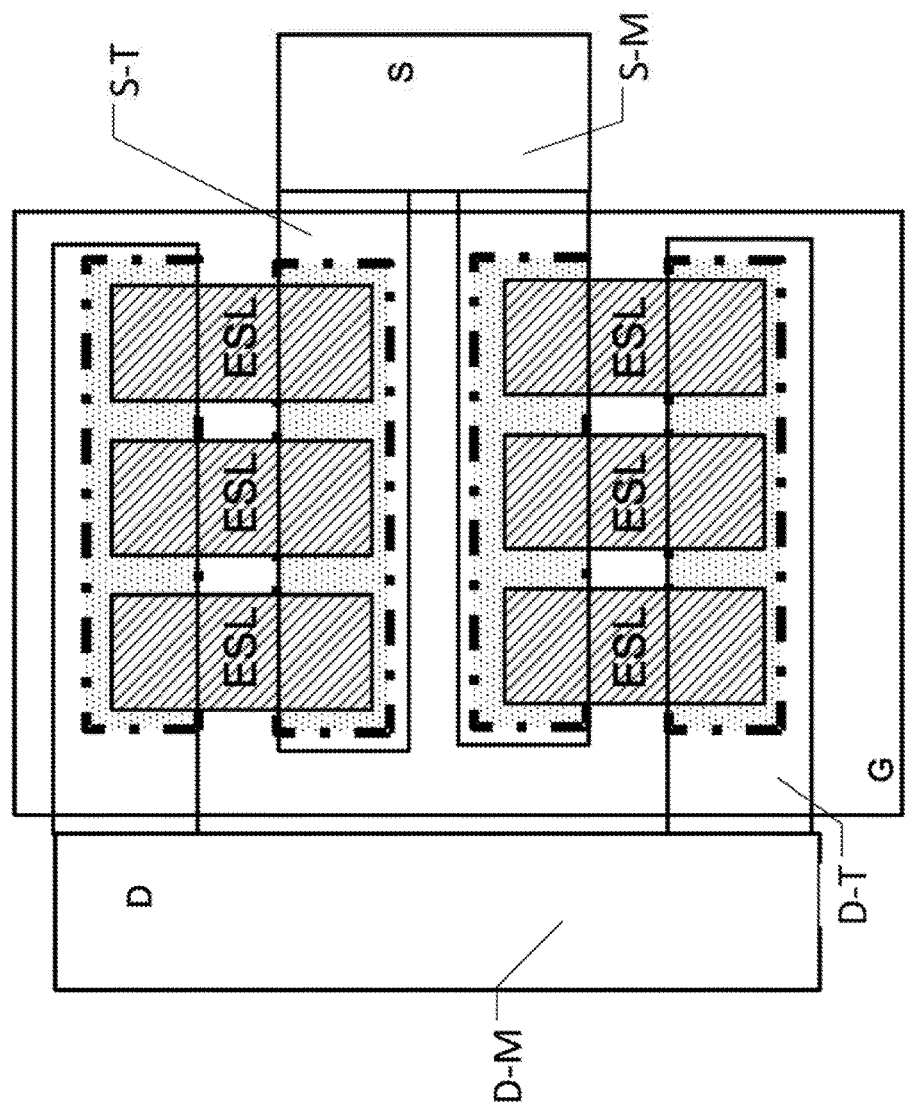
FIG. 5A is a diagram illustrating the structure of a thin film transistor in some embodiments.
Figure 5B:
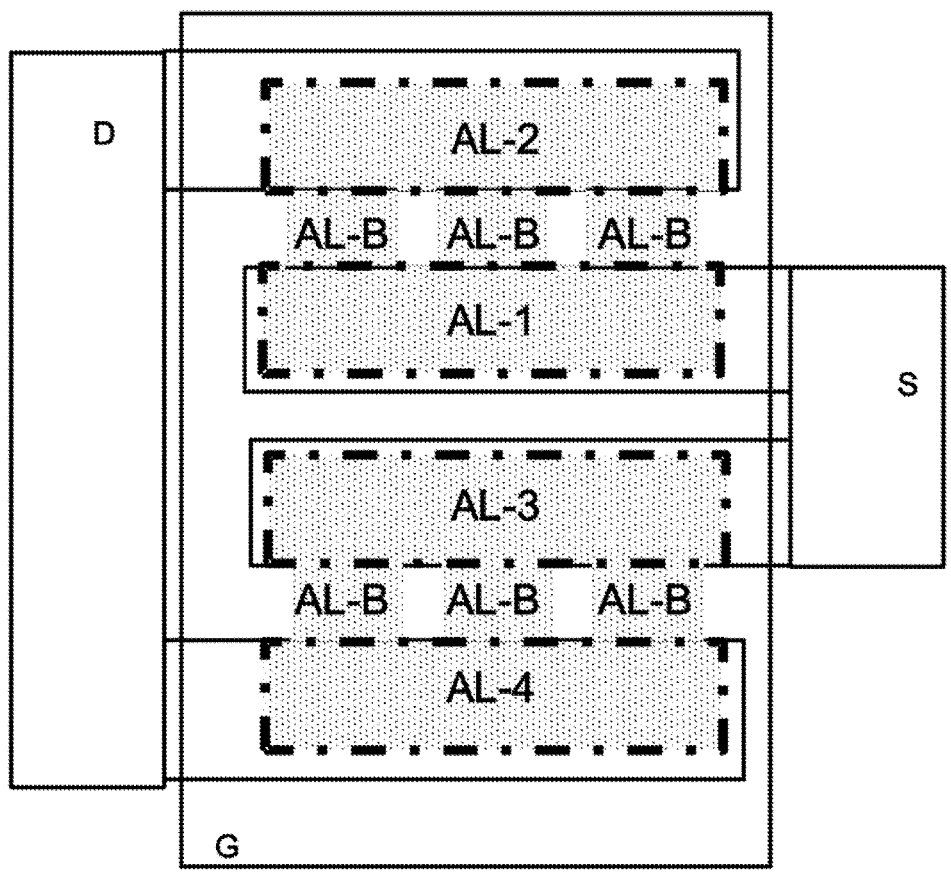
FIG. 5B is a diagram illustrating the structure of an active layer of a thin film transistor in some embodiments.

FIG. 5A is a diagram illustrating the structure of a thin film transistor in some embodiments. FIG. 5B is a diagram illustrating the structure of an active layer of a thin film transistor in some embodiments. Referring to FIGS. 5A-5B, the source electrode S in the embodiment includes a source electrode main body S-M, two source electrode teeth S-T integral with the source electrode main body and extending from the source electrode main body toward free ends of the two source electrode teeth. The drain electrode D in the embodiment includes a drain electrode main body D-M, two drain electrode teeth D-T integral with the drain electrode main body and extending from the drain electrode main body toward free ends of the two drain electrode teeth. As shown in FIGS. 5A-5B, the two source electrode teeth are sandwiched by the two drain electrode teeth so that one of the two drain electrode teeth is on one side of the source electrode S (e.g., the two source electrode teeth) and another of the two drain electrode teeth is on an opposite side of the source electrode S (e.g., the two source electrode teeth), and the source electrode S (e.g., the two source electrode teeth) are in the middle.

Referring to FIG. 5B, the active layer in the embodiment further includes a third semiconductor region AL-3, a fourth semiconductor region AL-4, and a plurality of additional semiconductor bridges AL-B each of which connecting the third semiconductor region AL-3 and the fourth semiconductor region AL-4. As shown in FIG. 5B, the plurality of additional semiconductor bridges AL-B are spaced apart from each other. Optionally, the plurality of additional semiconductor bridges AL-B are substantially parallel to each other.

Figure 5C:
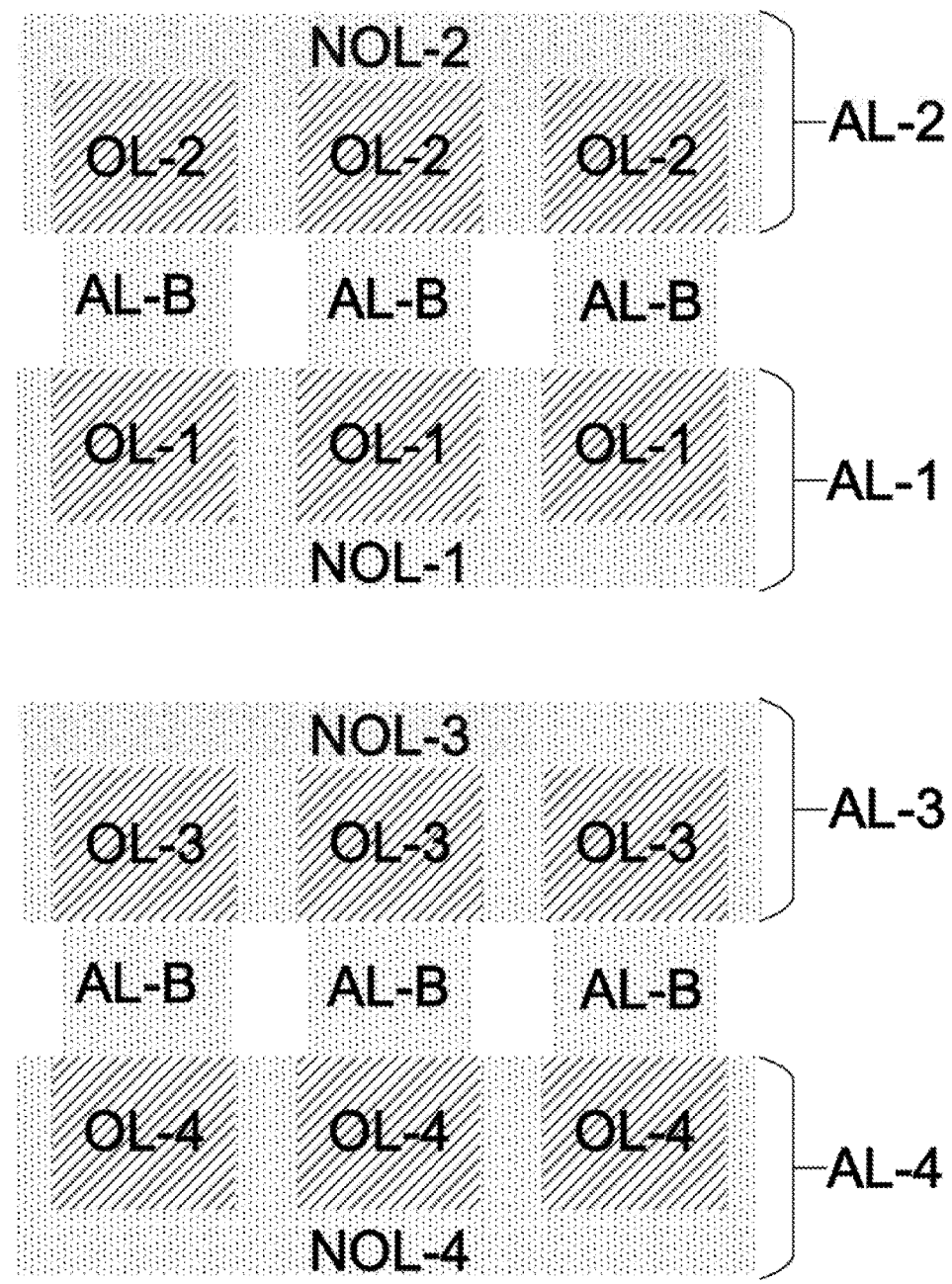
FIG. 5C is a diagram illustrating the structure of an active layer of a thin film transistor in some embodiments.

FIG. 5C is a diagram illustrating the structure of an active layer of a thin film transistor in some embodiments. Referring to FIG. 5C, the first semiconductor region AL-1 in the embodiment includes a first non-overlapping portion NOL-1, a projection of which is outside that of the etch stop layer in plan view of the base substrate; the second semiconductor region AL-2 in the embodiment includes a second non-overlapping portion NOL-2, a projection of which is outside that of the etch stop layer in plan view of the base substrate; the third semiconductor region AL-3 in the embodiment includes a third non-overlapping portion NOL-3, a projection of which is outside that of the etch stop layer in plan view of the base substrate, and the fourth semiconductor region AL-4 in the embodiment includes a fourth non-overlapping portion NOL-4, a projection of which is outside that of the etch stop layer in plan view of the base substrate. Optionally, as shown in FIG. 5C, the first semiconductor region AL-1 further includes one or more first overlapping portion OL-1, a projection of which overlaps with that of the etch stop layer in plan view of the base substrate; the second semiconductor region AL-2 further includes one or more second overlapping portion OL-2, a projection of which overlaps with that of the etch stop layer in plan view of the base substrate; the third semiconductor region AL-3 further includes one or more third overlapping portion OL-3, a projection of which overlaps with that of the etch stop layer in plan view of the base substrate, and the fourth semiconductor region AL-4 further includes one or more fourth overlapping portion OL-4, a projection of which overlaps with that of the etch stop layer in plan view of the base substrate.

Referring to FIGS. 5A-5C, the source electrode S in the embodiment is in contact with and on a side of the first non-overlapping portion NOL-L and the third non-overlapping portion NOL-3 distal to the base substrate, the drain electrode D in the embodiment is in contact with and on a side of the second non-overlapping portion NOL-2 and the fourth non-overlapping portion NOL-4 distal to the base substrate. Specifically, the first non-overlapping portion NOL-1 and the third non-overlapping portion NOL-3 are in contact with and on a side of the plurality of source electrode teeth proximal to the base substrate, and the second non-overlapping portion NOL-2 and the fourth non-overlapping portion NOL-4 are on a side of the plurality of drain electrode teeth proximal to the base substrate.

Figure 6A:
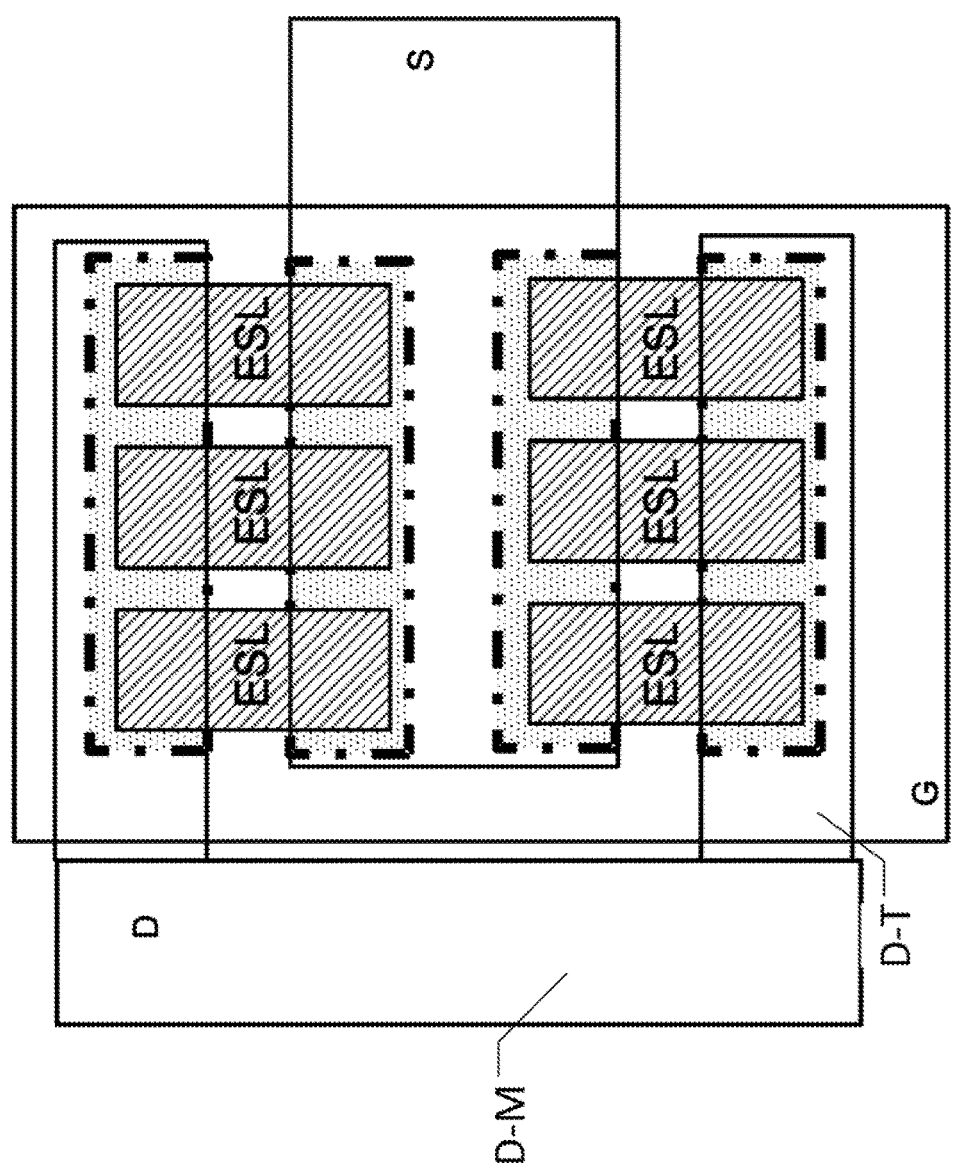
FIG. 6A is a diagram illustrating the structure of a thin film transistor in some embodiments.
Figure 6B:
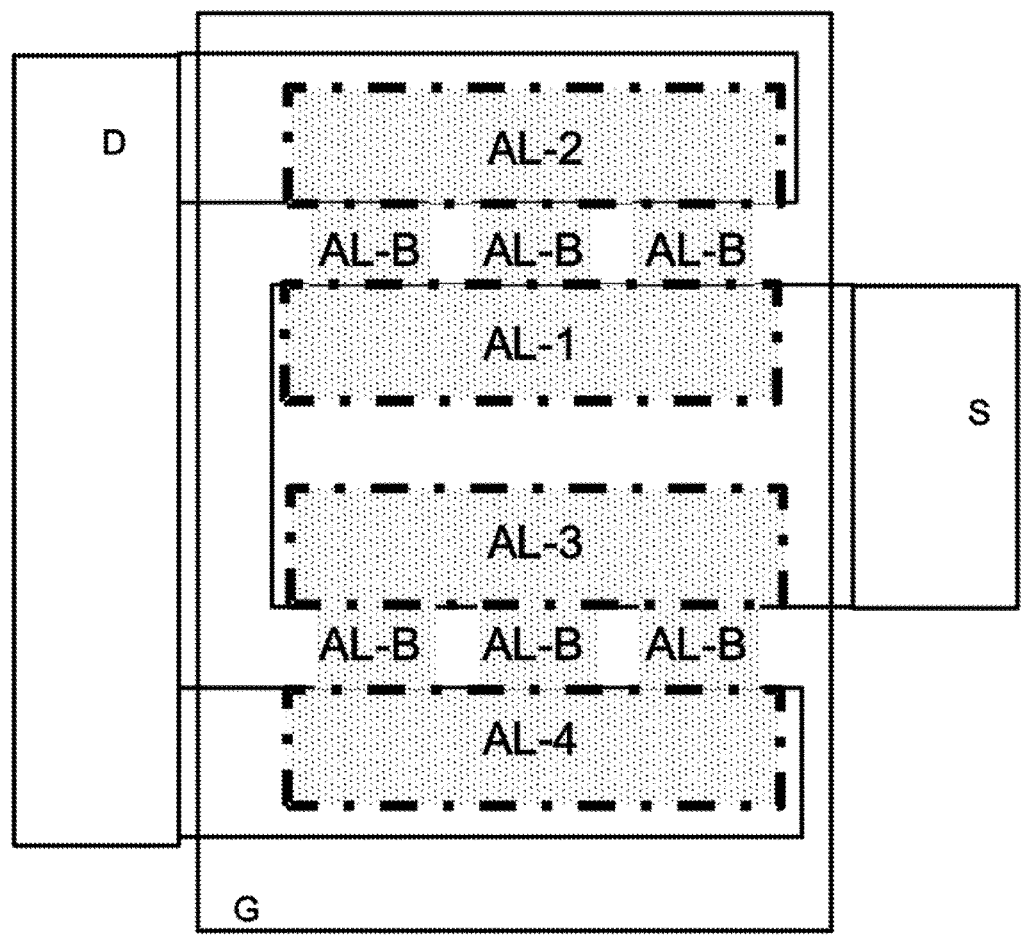
FIG. 6B is a diagram illustrating the structure of an active layer of a thin film transistor in some embodiments.

FIG. 6A is a diagram illustrating the structure of a thin film transistor in some embodiments. FIG. 6B is a diagram illustrating the structure of an active layer of a thin film transistor in some embodiments. The thin film transistor in FIGS. 6A-6B is largely similar to that of FIGS. SA-5C except that the source electrode S in FIGS. 6A-6B is an integral source electrode block. As shown in FIGS. 6A-6B, the drain electrode D in the embodiment includes a drain electrode main body D-M, two drain electrode teeth D-T integral with the drain electrode main body and extending from the drain electrode main body toward free ends of the two drain electrode teeth. The integral source electrode block is sandwiched by the two drain electrode teeth so that one of the two drain electrode teeth is on one side of the integral source electrode block and another of the two drain electrode teeth is on an opposite side of the integral source electrode block, and the integral source electrode block is in the middle.

Referring to FIG. 6B, the active layer in the embodiment further includes a third semiconductor region AL-3, a fourth semiconductor region AL-4, and a plurality of additional semiconductor bridges AL-B each of which connecting the third semiconductor region AL-3 and the fourth semiconductor region AL-4. As shown in FIG. 6B, the plurality of additional semiconductor bridges AL-B are spaced apart from each other. Optionally, the plurality of additional semiconductor bridges AL-B are substantially parallel to each other. The source electrode S in the embodiment is in contact with and on a side of the first non-overlapping portion and the third non-overlapping portion distal to the base substrate, the drain electrode D in the embodiment is in contact with and on a side of the second non-overlapping portion and the fourth non-overlapping portion distal to the base substrate. Specifically, the first non-overlapping portion and the third non-overlapping portion are in contact with and on a side of the integral source electrode block proximal to the base substrate, and the second non-overlapping portion and the fourth non-overlapping portion are in contact with and on a side of the two drain electrode teeth proximal to the base substrate.

Figure 7A:
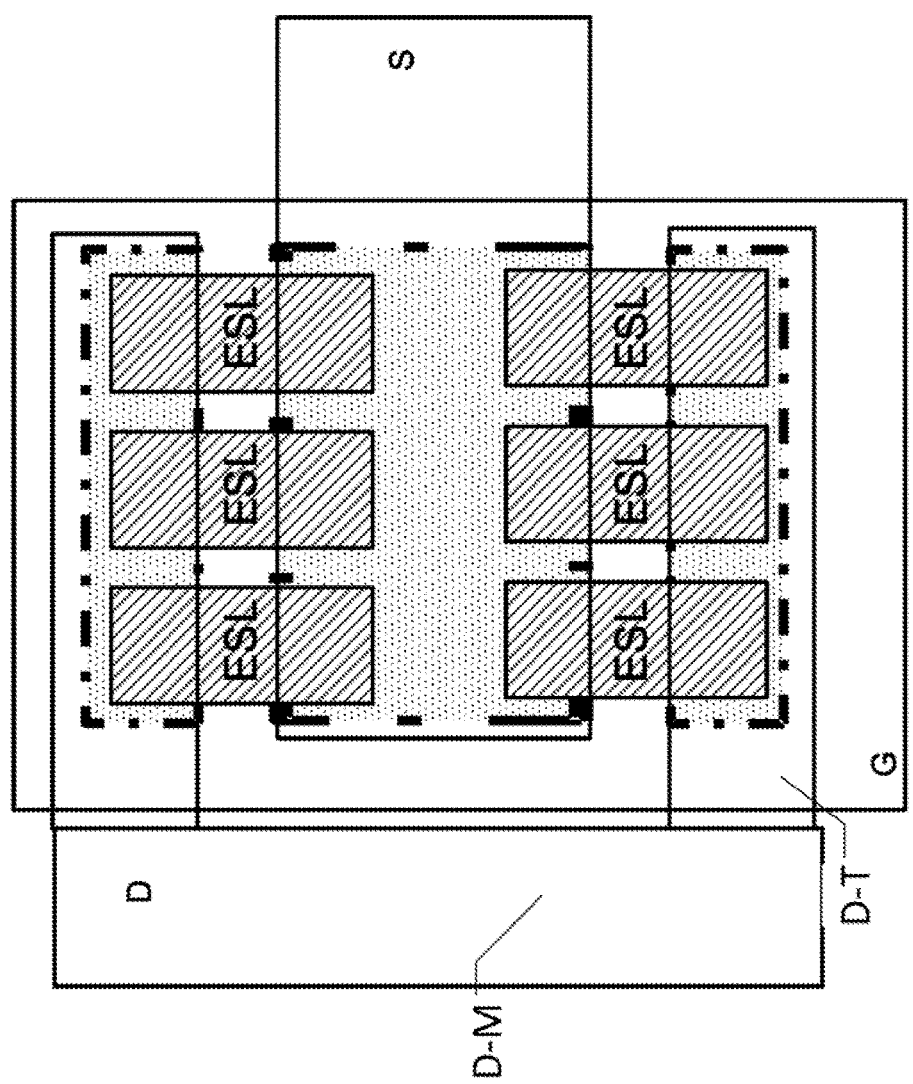
FIG. 7A is a diagram illustrating the structure of a thin film transistor in some embodiments.
Figure 7B:
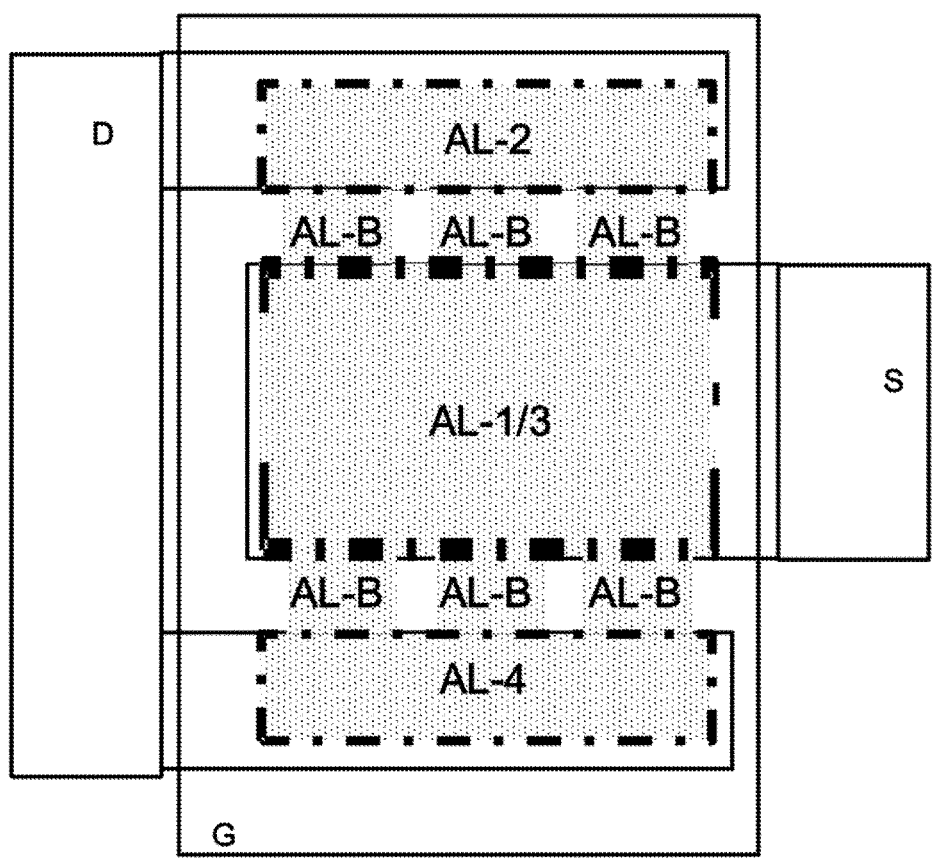
FIG. 7B is a diagram illustrating the structure of an active layer of a thin film transistor in some embodiments.

FIG. 7A is a diagram illustrating the structure of a thin film transistor in some embodiments. FIG. 7B is a diagram illustrating the structure of an active layer of a thin film transistor in some embodiments. Referring to FIGS. 7A and 7B, the thin film transistor in the embodiment is largely similar to that of FIGS. 6A-6B, except that the first semiconductor region AL-1 and the third semiconductor region AL-3 in the embodiment form an integral semiconductor region AL-1/3. Similarly, the first non-overlapping portion and the third non-overlapping portion in the embodiment constitute an integral non-overlapping portion.

Figure 8:
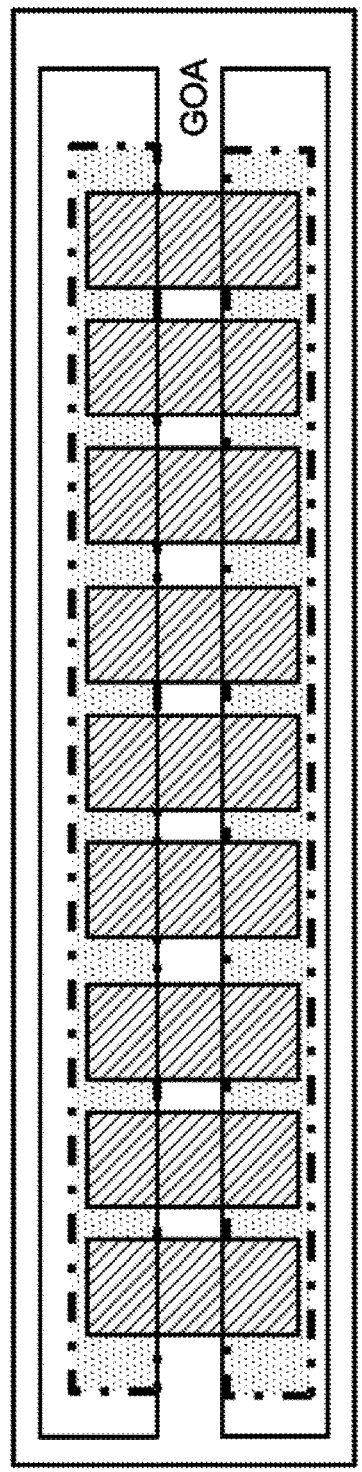
FIG. 8 is a diagram illustrating the structure of a gate drive on array (GOA) circuit in some embodiments.

FIG. 8 is a diagram illustrating the structure of a gate drive on array (GOA) circuit in some embodiments. Referring to FIG. 8, the GOA circuit in the embodiment includes a thin film transistor described herein. As shown in FIG. 8, the GOA circuit in the embodiment includes nine semiconductor bridges.

In some embodiments, the present thin film transistor is a thin film transistor in an organic light emitting display apparatus, e.g., a driving thin film transistor or an amplifying thin film transistor. Organic light emitting display apparatuses are current driven display apparatuses, placing a higher demand on thermal stability of the thin film transistor. The present thin film transistor has a much higher thermal stability as compared to the conventional thin film transistor, making them suitable for applications in organic light emitting display products.

In another aspect, the present disclosure provides a method of fabricating a thin film transistor. In some embodiments, the method includes forming an active layer on a base substrate having a first semiconductor region, a second semiconductor region, and a plurality of semiconductor bridges each of which connecting the first semiconductor region and the second semiconductor region; and forming an etch stop layer on a side of the active layer distal to the base substrate.

In some embodiments, the first semiconductor region and the second semiconductor region are formed to be spaced apart and arranged substantially along a first direction in a first plane. Optionally, the plurality of semiconductor bridges are formed to be spaced apart from each other, each of which is arranged substantially along a second direction on a second plane. Optionally, the first plane and the second plane are substantially parallel to each other. Optionally, the first plane and the second plane are a same plane. Optionally, the plurality of semiconductor bridges are formed to be substantially parallel to each other. Optionally, the first direction is substantially perpendicular to the second direction.

In some embodiments, the active layer is made of a material comprising $M1O_aN_b$, wherein M1 is a single metal or a combination of metals, a>0, and b≥0, e.g., the active layer is made of a metal oxide material or a metal oxynitride material. Examples of appropriate metal oxide active layer materials include, but are not limited to, indium gallium zinc oxide, zinc oxide, gallium oxide, indium oxide, HfInZnO (HIZO), amorphous InGaZnO (amorphous IGZO), InZnO, amorphous InZnO, ZnO:F, $In_2O_3$:Sn, $In_2O_3$:Mo, $Cd_2SnO_4$, ZnO:Al, $TiO_2$:Nb, and Cd—Sn—O. Examples of appropriate metal oxynitride active layer materials include, but are not limited to, zinc oxynitride, indium oxynitride, gallium oxynitride, tin oxynitride, cadmium oxynitride, aluminum oxynitride, germanium oxynitride, titanium oxynitride, silicon oxynitride, or combination thereof. Optionally, the active layer is made of a material comprising $M1O_aN_b$ doped with one or more metal element. Optionally, the active layer is made of a material comprising $M1O_aN_b$ doped with one or more non-metal element. Optionally, the active layer is made of a material comprising $M1O_aN_b$ doped with one or more metal element and one or more non-metal element.

Optionally, the etch stop layer is substantially resistant to an etchant for etching the first electrode and the second electrode (e.g., the source electrode and the drain electrode). Optionally, the etch stop layer is substantially resistant to a wet etchant for etching the first electrode and the second electrode. Optionally, the etch stop layer is made of a silicon-containing compound. Examples of silicon-containing compounds for making the etch stop layer include, but are not limited to, silicon oxide, silicon nitride, silicon oxynitride, silicon carbide, silicon oxycarbide, silicon, and silicon germanium.

In some embodiments, the first semiconductor region is formed to include a first non-overlapping portion, a projection of which is outside that of the etch stop layer in plan view of the base substrate. In some embodiments, the second semiconductor region is formed to include a second non-overlapping portion, a projection of which is outside that of the etch stop layer in plan view of the base substrate.

In some embodiments, the method further includes forming a first electrode (e.g., a source electrode or a drain electrode) on a side of the first non-overlapping portion distal to the base substrate; and forming a second electrode (e.g., a drain electrode or a source electrode) on a side of the second non-overlapping portion distal to the base substrate.

Optionally, the first electrode (e.g., a source electrode or a drain electrode) is formed to be in contact with and on a side of the first non-overlapping portion distal to the base substrate. Optionally, the second electrode (e.g., a drain electrode or a source electrode) is formed to be in contact with and on a side of the second non-overlapping portion distal to the base substrate.

In some embodiments, the method further includes forming an ohmic contact layer between the first electrode and the first non-overlapping portion. In some embodiments, the method further includes forming an ohmic contact layer between the second electrode and the second non-overlapping portion.

In some embodiments, the step of forming the active layer and the step of forming the etch stop layer are performed in a single patterning step. Optionally, the single patterning step involves use of a half-tone mask plate or a gray-tone mask plate. For example, in some embodiments, the single patterning step includes forming a semiconductor material layer made of $M1O_aN_b$, wherein M1 is a single metal or a combination of metals, a>0, and b≥0, on the base substrate; forming an etch stop material layer on a side of the semiconductor material layer distal to the base substrate; coating a photoresist layer on a side of the etch stop material layer distal to the semiconductor material layer; exposing the photoresist layer with a half-tone mask plate or a gray-tone mask plate; developing the exposed photoresist layer to obtain a photoresist pattern comprising a first section corresponding to the active layer and a second section which is outside of the first section; the first section comprising a first zone corresponding to the first non-overlapping portion and the second non-overlapping portion, and a second zone corresponding to remaining parts of the first section; the depth of the second zone is larger than that of the first zone, and the photoresist material is removed in the second section; removing the etch stop material layer in the second section; removing the semiconductor material layer in the second section thereby forming an active layer pattern corresponding to the active layer; removing the photoresist layer in the first zone while maintaining the photoresist layer in the second zone; removing the etch stop material layer in the first zone thereby forming an etch stop layer pattern corresponding to the etch stop layer and; and removing the photoresist layer in the second zone.

In some embodiments, the step of forming the active layer, the step of forming the first electrode, and the step of forming the second electrode are performed in a single patterning step. For example, in some embodiments, the method may include forming a semiconductor material layer including $M1O_aN_b$, wherein M1 is a single metal or a combination of metals, a>0, and b≥0, on the base substrate; forming an etch stop material layer on a side of the semiconductor material layer distal to the base substrate; coating a first photoresist layer on a side of the etch stop material layer distal to the semiconductor material layer, exposing the first photoresist layer with a mask plate having a pattern corresponding to the etch stop layer; developing the exposed first photoresist layer to obtain a first photoresist pattern having a first section corresponding to the etch stop layer and a second section which is outside of the first section; removing the etch stop material layer in the second section thereby forming an etch stop layer pattern corresponding to the etch stop layer; forming an electrode material layer on a side of the etch stop layer and the semiconductor material layer distal to the base substrate; coating a second photoresist layer on a side of the electrode material layer distal to the base substrate; exposing the second photoresist layer with a second mask plate having a pattern corresponding to the first electrode and the second electrode; developing the exposed second photoresist layer to obtain a second photoresist pattern having a third section corresponding to the first electrode and the second electrode, and a fourth section which is outside of the first section; removing the electrode material layer in the fourth section thereby forming a first electrode pattern corresponding to the first electrode and a second electrode pattern corresponding to the second electrode; and removing the semiconductor material layer in the fourth section thereby forming an active layer pattern corresponding to the active layer.

Optionally, the semiconductor material layer may be formed by, e.g., coating, magnetron sputtering, and vapor deposition such as plasma enhanced chemical vapor deposition (PEVCD).

Optionally, the etch stop material layer may be formed by, e.g., coating, magnetron sputtering, and vapor deposition such as plasma enhanced chemical vapor deposition (PE-VCD).

Optionally, the etch stop material layer may be removed by an etching process, e.g., a dry etching process.

Optionally, the semiconductor material layer may be removed by an etching process, e.g., a wet etching process.

Optionally, the photoresist layer may be removed by an ashing process.

Optionally, the electrode material layer may be removed by an etching process, e.g., a wet etching process.

In some embodiments, the thin film transistor is a bottom-gate thin film transistor. In some embodiments, prior to forming the active layer, the method further comprises forming a gate electrode layer on the base substrate, and forming a gate insulating layer on a side of the gate electrode layer distal to the base substrate.

In another aspect, the present disclosure provides a display panel having a thin film transistor described herein or fabricated by a method described herein. In another aspect, the present disclosure provides a display apparatus having a display panel described herein. Examples of appropriate display apparatuses include, but are not limited to, a liquid crystal display panel, an electronic paper, an organic light emitting display panel, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor, comprising:
    a base substrate;
    an active layer on the base substrate comprising a first semiconductor region, a second semiconductor region, and a plurality of semiconductor bridges each of which connecting the first semiconductor region and the second semiconductor region; the plurality of semiconductor bridges spaced apart from each other; the active layer being made of a material comprising $M1O_aN_b$, wherein M1 is a single metal or a combination of metals, a>0, and b≥0;
    an etch stop layer on a side of the active layer distal to the base substrate; the first semiconductor region comprising a first non-overlapping portion, a projection of which is outside that of the etch stop layer in plan view of the base substrate; the second semiconductor region comprising a second non-overlapping portion, a projection of which is outside that of the etch stop layer in plan view of the base substrate;
    a first node on a side of the first non-overlapping portion distal to the base substrate; and
    a second node on a side of the second non-overlapping portion distal to the base substrate.

2. The thin film transistor of claim 1, wherein the first semiconductor region is an integral semiconductor block connecting a plurality of first terminus of the plurality of semiconductor bridges; the second semiconductor region is an integral semiconductor block connecting a plurality of second terminus of the plurality of semiconductor bridges.

3. The thin film transistor of claim 1, wherein the etch stop layer comprises a plurality of etch stop blocks spaced apart from each other, each etch stop block at least partially overlapping with each semiconductor bridge.

4. The thin film transistor of claim 1, wherein the plurality of semiconductor bridges are spaced apart from each other by a distance in the range of about 3 μm to about 15 μm.

5. The thin film transistor of claim 1, wherein each of the plurality of semiconductor bridges has a width in the range of about 3 μm to about 20 μm.

6. The thin film transistor of claim 1, wherein each of the plurality of semiconductor bridges has a rectangular shape.

7. The thin film transistor of claim 1, wherein each semiconductor bridge comprises a middle portion having concaved-shaped lateral edges and a width narrower than widths of other portions of the each semiconductor bridge.

8. The thin film transistor of claim 1, wherein the active layer further comprises a third semiconductor region, a fourth semiconductor region, and a plurality of additional semiconductor bridges each of which connecting the third semiconductor region and the fourth semiconductor region; the plurality of additional semiconductor bridges spaced apart from each other; the third semiconductor region comprising a third non-overlapping portion, a projection of which is outside that of the etch stop layer in plan view of the base substrate; the fourth semiconductor region comprising a fourth non-overlapping portion, a projection of which is outside that of the etch stop layer in plan view of the base substrate;
    the first node is on a side of the third non-overlapping portion distal to the base substrate; and
    the second node is on a side of the fourth non-overlapping portion distal to the base substrate.

9. The thin film transistor of claim 8, wherein the third semiconductor region is an integral semiconductor block connecting a plurality of first terminus of the plurality of additional semiconductor bridges; the fourth semiconductor region is an integral semiconductor block connecting a plurality of second terminus of the plurality of additional semiconductor bridges.

10. The thin film transistor of claim 8, wherein the etch stop layer comprises a plurality of additional etch stop blocks spaced apart from each other, each additional etch stop block at least partially overlapping with each additional semiconductor bridge.

11. The thin film transistor of claim 8, wherein the first node comprises a first node main body, a plurality of first node teeth integral with the first node main body and extending from the first node main body toward free ends of the plurality of first node teeth;
the second node comprises a second node main body, a plurality of second node teeth integral with the second node main body and extending from the second node main body toward free ends of the plurality of second node teeth;
each of the plurality of first node teeth and each of the plurality of second node teeth are alternately arranged and spaced apart so that the first node and the second node are interleaving;
the first non-overlapping portion and the third non-overlapping portion are on a side of the plurality of first node teeth proximal to the base substrate, the second non-overlapping portion and the fourth non-overlapping portion are on a side of the plurality of second node teeth proximal to the base substrate.

12. The thin film transistor of claim 8, wherein the first node comprises a first node main body, two first node teeth integral with the first node main body and extending from the first node main body toward free ends of the two first node teeth;
the second node comprises a second node main body, two second node teeth integral with the second node main body and extending from the second node main body toward free ends of the two second node teeth;
the two first node teeth are sandwiched by the two second node teeth so that one of the two second node teeth is on one side of the two first node teeth and another of the two second node teeth is on an opposite side of the two first node teeth, and the two first node teeth are in the middle;
the first non-overlapping portion and the third non-overlapping portion are on a side of the two first node teeth proximal to the base substrate, the second non-overlapping portion and the fourth non-overlapping portion are on a side of the two second node teeth proximal to the base substrate.

13. The thin film transistor of claim 8, wherein the first node comprises an integral first node block;
the second node comprises a second node main body, two second node teeth integral with the second node main body and extending from the second node main body toward free ends of the two second node teeth;
the integral first node block is sandwiched by the two second node teeth so that one of the two second node teeth is on one side of the integral first node block and another of the two second node teeth is on an opposite side of the integral first node block, and the integral first node block is in the middle;
the first non-overlapping portion and the third non-overlapping portion are on a side of the integral first node block proximal to the base substrate, the second non-overlapping portion and the fourth non-overlapping portion are on a side of the two second node teeth proximal to the base substrate.

14. The thin film transistor of claim 1, wherein the first semiconductor region further comprising a first overlapping portion, a projection of which overlaps with that of the etch stop layer in plan view of the base substrate; the second semiconductor region further comprising a second overlapping portion, a projection of which overlaps with that of the etch stop layer in plan view of the base substrate.

15. The thin film transistor of claim 1, wherein the etch stop layer is substantially resistant to an etchant for etching the first node and the second node.

16. A gate drive on array (GOA) circuit, comprising a thin film transistor of claim 1.

17. A display apparatus comprising a thin film transistor of claim 1.

18. A method of fabricating a thin film transistor, comprising:
forming an active layer on a base substrate comprising a first semiconductor region, a second semiconductor region, and a plurality of semiconductor bridges each of which connecting the first semiconductor region and the second semiconductor region; the plurality of semiconductor bridges spaced apart from each other; the active layer being made of a material comprising $M1O_aN_b$, wherein M1 is a single metal or a combination of metals, $a>0$, and $b\geq 0$;
forming an etch stop layer on a side of the active layer distal to the base substrate; the first semiconductor region comprising a first non-overlapping portion, a projection of which is outside that of the etch stop layer in plan view of the base substrate; the second semiconductor region comprising a second non-overlapping portion, a projection of which is outside that of the etch stop layer in plan view of the base substrate;
forming a first node on a side of the first non-overlapping portion distal to the base substrate; and
forming a second node on a side of the second non-overlapping portion distal to the base substrate.

19. The method of claim 18, wherein the step of forming the active layer and the step of forming the etch stop layer are performed in a single patterning step, the single patterning step comprises:
forming a semiconductor material layer comprising $M1O_aN_b$, wherein M1 is a single metal or a combination of metals, $a>0$, and $b\geq 0$, on the base substrate;
forming an etch stop material layer on a side of the semiconductor material layer distal to the base substrate;
coating a photoresist layer on a side of the etch stop material layer distal to the semiconductor material layer;
exposing the photoresist layer with a half-tone mask plate or a gray-tone mask plate;
developing the exposed photoresist layer to obtain a photoresist pattern comprising a first section corresponding to the active layer and a second section which is outside of the first section; the first section comprising a first zone corresponding to the first non-overlapping portion and the second non-overlapping portion, and a second zone corresponding to remaining parts of the first section; the depth of the second zone is larger than that of the first zone, and the photoresist material is removed in the second section;
removing the etch stop material layer in the second section;
removing the semiconductor material layer in the second section thereby forming an active layer pattern corresponding to the active layer;
removing the photoresist layer in the first zone while maintaining the photoresist layer in the second zone;

removing the etch stop material layer in the first zone thereby forming an etch stop layer pattern corresponding to the etch stop layer; and removing the photoresist layer in the second zone.

20. The method of claim 18, wherein the step of forming the active layer, the step of forming the first node, and the step of forming the second node are performed in a single patterning step, the method comprising:

forming a semiconductor material layer comprising $M1O_aN_b$, wherein M1 is a single metal or a combination of metals, a>0, and b≥0, on the base substrate;

forming an etch stop material layer on a side of the semiconductor material layer distal to the base substrate;

coating a first photoresist layer on a side of the etch stop material layer distal to the semiconductor material layer;

exposing the first photoresist layer with a mask plate having a pattern corresponding to the etch stop layer;

developing the exposed first photoresist layer to obtain a first photoresist pattern comprising a first section corresponding to the etch stop layer and a second section which is outside of the first section;

removing the etch stop material layer in the second section thereby forming an etch stop layer pattern corresponding to the etch stop layer;

forming an electrode material layer on a side of the etch stop layer and the semiconductor material layer distal to the base substrate;

coating a second photoresist layer on a side of the electrode material layer distal to the base substrate;

exposing the second photoresist layer with a second mask plate having a pattern corresponding to the first node and the second node;

developing the exposed second photoresist layer to obtain a second photoresist pattern comprising a third section corresponding to the first node and the second node, and a fourth section which is outside of the first section;

removing the electrode material layer in the fourth section thereby forming a first node pattern corresponding to the first node and a second node pattern corresponding to the second node; and removing the semiconductor material layer in the fourth section thereby forming an active layer pattern corresponding to the active layer.

* * * * *